United States Patent
Klamkin et al.

(10) Patent No.: US 12,527,118 B1
(45) Date of Patent: Jan. 13, 2026

(54) SENSOR ARRAY DEVICE AND METHOD THEREFOR

(71) Applicant: Aeluma, Inc., Goleta, CA (US)

(72) Inventors: Jonathan Klamkin, Goleta, CA (US); Bowen Song, Goleta, CA (US)

(73) Assignee: Aeluma, Inc., Goleta, CA (US)

( * ) Notice: Subject to any disclaimer, the term of this patent is extended or adjusted under 35 U.S.C. 154(b) by 595 days.

(21) Appl. No.: 18/152,639

(22) Filed: Jan. 10, 2023

Related U.S. Application Data

(60) Provisional application No. 63/306,409, filed on Feb. 3, 2022.

(51) Int. Cl.
  *H10H 20/01* (2025.01)
  *H10H 20/826* (2025.01)
  *H10H 20/852* (2025.01)

(52) U.S. Cl.
  CPC ........ *H10H 20/01* (2025.01); *H10H 20/0137* (2025.01); *H10H 20/8264* (2025.01); *H10H 20/852* (2025.01)

(58) Field of Classification Search
  CPC .. H10H 20/01; H10H 20/852; H10H 20/8264; H10H 20/0137
  See application file for complete search history.

(56) References Cited

U.S. PATENT DOCUMENTS

| | | | |
|---|---|---|---|
| 12,433,061 B1* | 9/2025 | Shi | G02B 5/22 |
| 2007/0267653 A1* | 11/2007 | Yoneda | H10F 77/148 |
| | | | 257/E31.039 |
| 2020/0168659 A1* | 5/2020 | Cumming | H10F 71/127 |
| 2021/0167244 A1* | 6/2021 | Razeghi | H10F 71/1272 |
| 2022/0413156 A1* | 12/2022 | Klamkin | H10F 39/8033 |

* cited by examiner

Primary Examiner — Matthew C Landau
Assistant Examiner — Dmitriy Yemelyanov

(57) ABSTRACT

A sensor device and method of fabrication therefor. The method includes providing a partially completed semiconductor substrate having the following stacked materials: a silicon substrate, a buffer material, an n-type semiconductor material, an unintentionally doped (UID) optically absorptive material, a UID optically transparent semiconductor material, and a native insulating material. The substrate is sealed in a predetermined environment within a first carrier device, and then transferred from a first geographic location to a second geographic location. The substrate is then transferred to a second carrier device and cleaned. A dielectric material is formed overlying the substrate and patterned to form a p-type contact region and an n-type contact region. A p-type semiconductor region is formed via the p-type contact region, a p-type metal contact is formed overlying the p-type contact region, and an n-type metal contact is formed overlying the n-type contact region to form a common n-type electrode.

20 Claims, 25 Drawing Sheets

SENSOR ARRAY DEVICE AND METHOD THEREFOR

CROSS-REFERENCES TO RELATED APPLICATIONS

The present application claims priority to the following patent application: U.S. Provisional Pat. App. No. 63/306,409, filed Feb. 3, 2022. The present application also incorporates by reference, for all purposes, the following commonly owned patent application: U.S. patent application Ser. No. 17/356,208, filed Jun. 23, 2021.

BACKGROUND OF THE INVENTION

Electronics have proliferated over the years. These devices rely on miniature chips made from semiconductor materials such as Silicon (Si). These materials are also used to make sensing devices that can capture images of scenes. Si is widely used because it is an abundant material and Si semiconductor manufacturing is extremely mature due to the investments made in the electronics industry. A common technology process is called complementary metal oxide semiconductor, or "CMOS." The CMOS technology was developed for manufacturing integrated circuits but is now used for image sensors. Such image sensors are called CMOS image sensors. Often times, such CMOS image sensors are manufactured using high-volume manufacturing with 12-inch Si wafers.

Despite the advances with CMOS image sensors, limitations or drawbacks exist. For example, CMOS image sensors have limitations in the detectable wavelength range. Additionally, such CMOS image sensors suffer from poor sensitivity at longer wavelengths within the detectable wavelength range. These and other limitations may also exist.

From the above, it is desired that industry develop improved sensing devices.

BRIEF SUMMARY OF THE INVENTION

The present invention is generally related to electronic devices. More specifically, the present invention provides techniques related to sensor devices and sensor arrays using semiconductor materials on Si, along with subsequent circuit fabrication and integration methods. Merely by way of example, the present invention can be applied to various applications including image sensing, range finding, including LIDAR, among others, but it will be recognized that there are many other applications.

According to an example, the present invention provides a method for fabricating a sensor device. The method can include providing a partially completed semiconductor substrate that includes at least a silicon substrate, a buffer material overlying the silicon substrate, and a plurality of overlying semiconductor materials. The plurality of semiconductor materials can include an n-type semiconductor layer overlying the buffer material, an unintentionally doped (UID) optically absorptive material, and a UID optically transparent semiconductor material (or a p-type semiconductor material). The partially completed semiconductor substrate can also include an insulating material (e.g., native insulating material, native oxide, or the like) overlying the semiconductor layers. In a specific example, a transition layer can be formed overlying the buffer material and spatially configured between the buffer material and the plurality of semiconductor layers (e.g., between the buffer material and the n-type semiconductor material).

The partially completed semiconductor substrate can be placed into a first carrier device, which can include a wafer boat, a Front Opening Unified Pod (FOUP), a Front Opening Shipping Box (FOSB), or the like. The first carrier device can also be sealed and maintained in a predetermined environment including a nitrogen containing material, inert gas, clean dry air (CDA), or the like. This first carrier device with the partially completed semiconductor substrate can be transferred from a first geographic location to a second geographic location. The partially completed substrate can then be transferred to a second carrier device, which can include wafer fabrication equipment, semiconductor manufacturing equipment, chip foundry equipment, or the like. Further, the partially completed semiconductor can be cleaned using one or more methods, such as a wet chemical treatment, an ultrasonic bath, a solvent, purified water, deionized water, etch dilution, a milling process, a gas blowing process, a spin drying process, or the like.

After the transfer and cleaning process, the partially completed semiconductor substrate can be further processed to form p-type and n-type metal contacts. A dielectric material can be formed overlying a surface region of the partially completed semiconductor substrate. A p-type contact region can be formed overlying a first portion of the surface region to define a pattern in the dielectric material. A p-type semiconductor region can be formed using the pattern to introduce a p-type impurity into the UID optically transparent semiconductor material using either an implantation or diffusion process. A p-type metal contact region can be formed overlying the p-type contact region. One or more portions of the UID optically transparent semiconductor material, the n-type semiconductor material, and the UID optically absorptive semiconductor material can be etched to define an n-type contact opening. Further, an n-type metal contact region can be formed within the etched portions to form a common n-type electrode.

Benefits or advantages are achieved over conventional techniques. The integration platform based on semiconductor materials and device structures on Si can enable large-volume manufacturing of sensor and sensor array devices. These devices fabricated using the present techniques can exhibit improved detectable wavelength range, higher sensitivity, or other related performance metrics. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1:
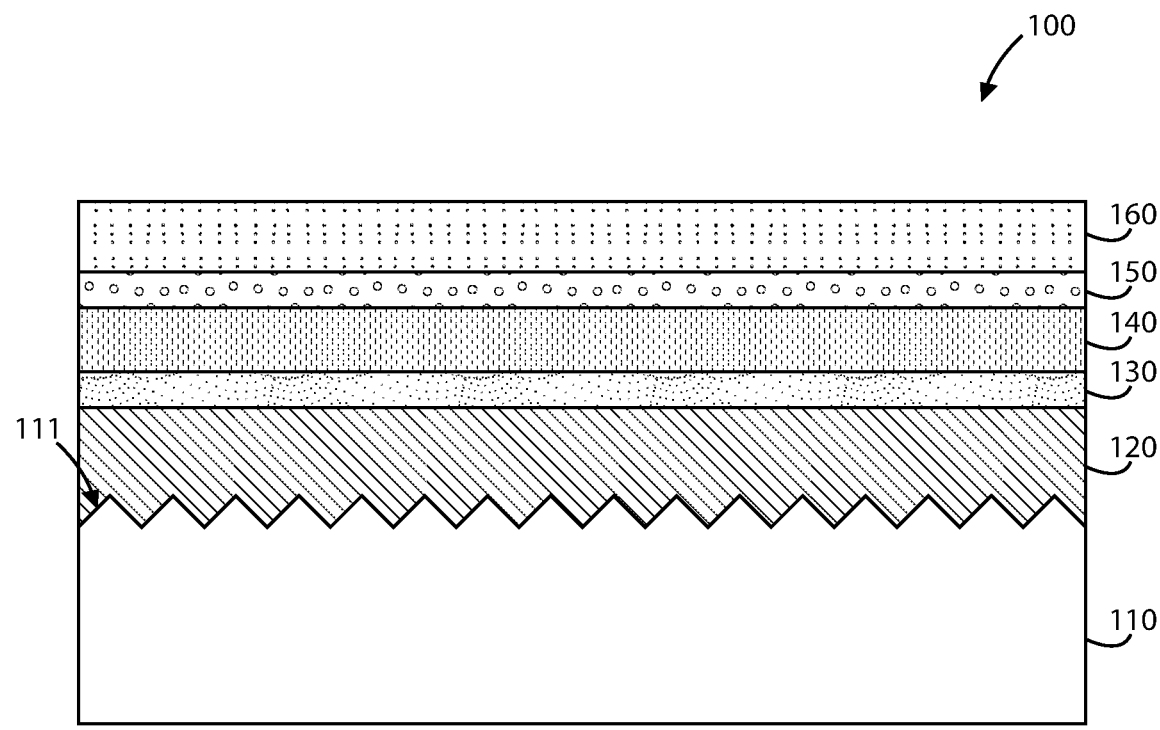
FIGS. 1 to 8 are simplified diagrams illustrating a method of fabricating a sensor device according to an example of the present invention.

The present invention is generally related to electronic devices. More specifically, the present invention provides techniques related to sensor devices and sensor arrays using semiconductor materials on Si, along with subsequent circuit fabrication and integration methods. Merely by way of example, the present invention can be applied to various applications including image sensing, range finding, including LIDAR, among others, but it will be recognized that there are many other applications.

In an example, the present invention provides method and device for realizing highly manufacturable and scalable semiconductor devices, including sensor devices and sensor arrays, on Si substrates. By directly depositing semiconductor materials on Si substrates, mature Si microelectronics manufacturing processes can be leveraged to fabricate high performance sensor devices and sensor arrays. Deposition on 12-inch Si substrates, which are common for CMOS technologies, enables the subsequent fabrication in CMOS manufacturing lines; however, the technology is not limited to 12-inch Si substrates only. Semiconductor materials can be deposited directly onto Si substrates with the techniques described in the present invention.

The deposition of semiconductor materials can include heteroepitaxy and related techniques. The heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, silicon on insulator (SOI), miscut Si, SOI on miscut Si, or germanium (Ge) on Si, without departing from the scope of the invention.

In another embodiment, the semiconductor nucleation, buffer materials and subsequent photodetector materials may be deposited and formed by selective area heteroepitaxy, whereby the Si or similar substrate could be first patterned with a dielectric to form recesses, within which the semiconductor nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the semiconductor material on Si, for facilitating photodetector fabrication, and also for realization of novel device structures. Selective area heteroepitaxy can improve material quality by releasing thermal strain caused by the mismatch in thermal expansion coefficient between the semiconductor materials and the Si, and by providing aspect ratio trapping of defects and dislocations.

FIGS. 1 to 8 are simplified diagrams illustrating a method of fabricating a sensor device according to an example of the present invention. In these figures, shared reference numerals in subsequent figures refer to the same elements as described in previous figures. Further, with regard to the method discussed below, steps may be added, removed, rearranged, or combined depending upon the application.

FIG. 1 is a simplified diagram of a sensor device 100 according to an example of the present invention. As shown, device 100 is a partially completed semiconductor substrate in an intermediate stage of fabrication for a sensor or sensor array device. Here, device 100 can include a Si substrate 110 with an overlying buffer material 120. In this case, the surface region 111 of the Si substrate 110 underlying the buffer material 120 is patterned with recesses. Photodetector device materials, including an n-type semiconductor material 140, an unintentionally doped (UID) optically absorptive semiconductor material 150, and a UID optically transparent semiconductor material 160 (or p-type semiconductor material), are spatially configured overlying the buffer material 120. In a specific example, the photodetector device materials can have repeating or alternating layers of the previously mentioned materials.

In a specific example, the device materials can include InP, InGaAs, gallium arsenide (GaAs), gallium phosphide (GaP), indium gallium arsenide phosphide (InGaAsP), indium aluminum gallium arsenide (InAlGaAs), indium arsenide (InAs), indium gallium phosphide (InGaP), or a combination thereof.

Additionally, the photodetector device structure can be configured with a separate absorption material comprising InGaAs or InGaAsP, and a multiplication material comprising InP whereby the multiplication material generates additional charge carriers by avalanche gain.

In a specific example, a transition material 130 is spatially configured between the buffer material 120 and the photodetector device materials (140, 150, 160). The transition material 130 can be configured with a material composition that transitions or partially transitions between an underlying material and an overlying material. As an example, the transition material 130 can have a material composition that partially transitions from the buffer material 120 to the n-type semiconductor material 140.

In an example, the partially completed semiconductor substrate can also include an insulating material (e.g., native insulating material, native oxide, or the like) overlying the semiconductor layers. In a specific example, a transition layer can be formed overlying the buffer material and spatially configured between the buffer material and the plurality of semiconductor layers (e.g., between the buffer material and the n-type semiconductor material).

In cases in which further processing needs to be done at another location, the partially completed semiconductor substrate can be placed into a first carrier device, which can include a wafer boat, a Front Opening Unified Pod (FOUP), a Front Opening Shipping Box (FOSB), or the like. The first carrier device can also be sealed and maintained in a predetermined environment including a nitrogen containing material, inert gas, clean dry air (CDA), or the like. This first carrier device with the partially completed semiconductor substrate can be transferred from a first geographic location to a second geographic location. The partially completed substrate can then be transferred to a second carrier device, which can include wafer fabrication equipment, semiconductor manufacturing equipment, chip foundry equipment, or the like. Further, the partially completed semiconductor can be cleaned using one or more methods, such as a wet chemical treatment, an ultrasonic bath, a solvent, purified water, deionized water, etch dilution, a milling process, a gas blowing process, a spin-drying process, or the like.

Figure 2:
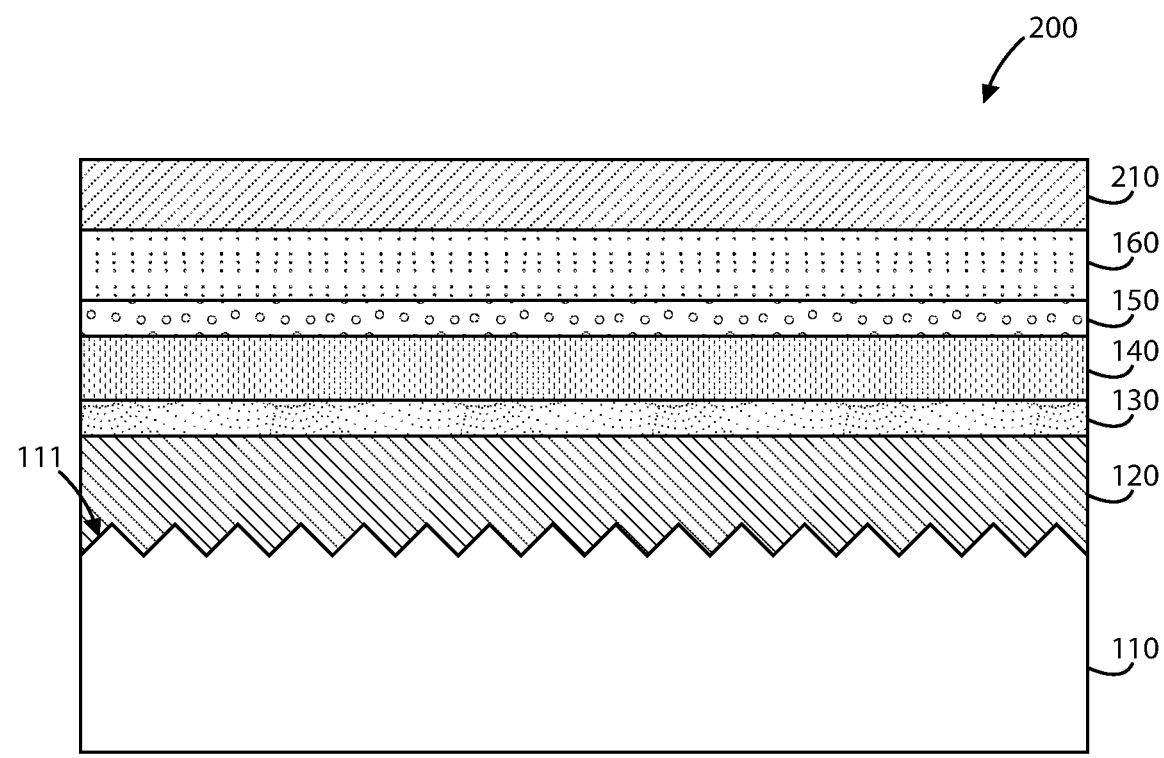

FIG. 2 is a simplified diagram illustrating an example method step of forming a dielectric material 210 overlying a surface region of the partially completed semiconductor substrate 100 of FIG. 1, resulting in device 200. As shown, the dielectric material 210 is formed overlying the UID optically transparent semiconductor material 160. In an example, the dielectric material is selected from silicon nitride, aluminum nitride, an oxide material, a nitride material, silicon dioxide, aluminum dioxide, a silicate material, or the like.

Figure 3:
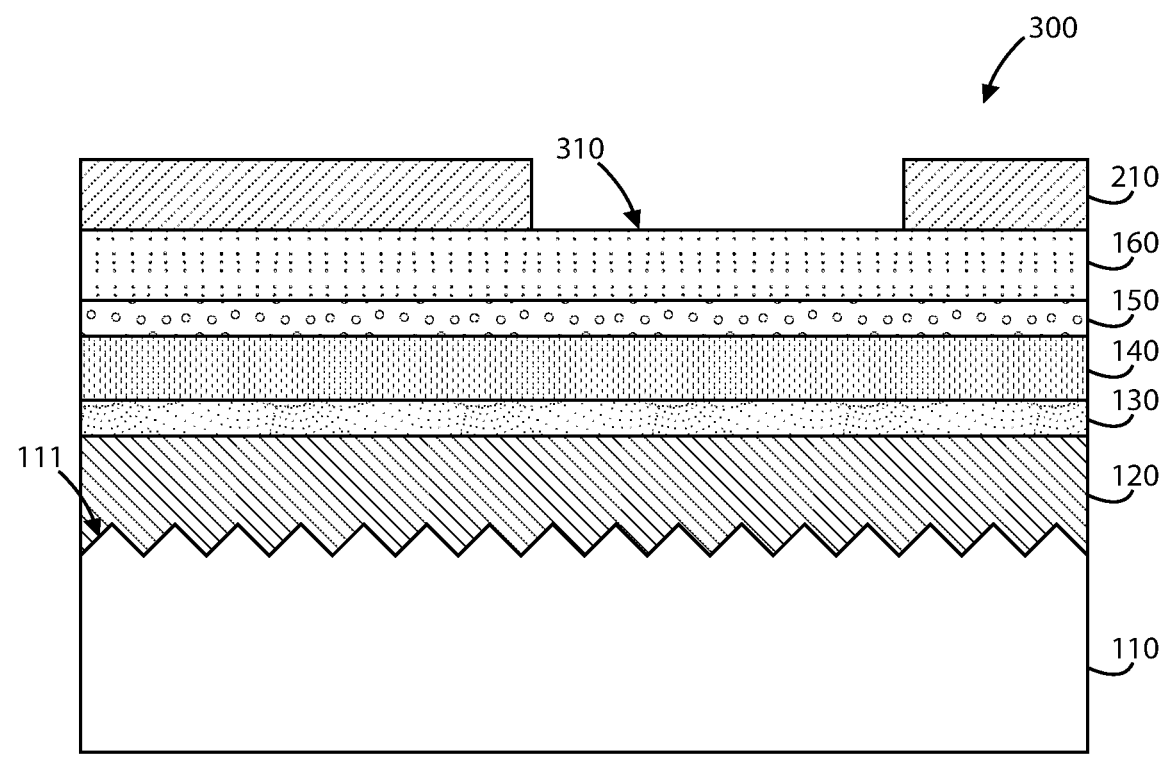

FIG. 3 is a simplified diagram illustrating an example method step of forming a p-type contact region 310 overlying a first portion of the partially completed substrate surface region to define a pattern in the dielectric material, resulting in device 300. As shown, the p-type contact region 310 can include an exposed region of the UID optically transparent semiconductor material 160.

Figure 4:
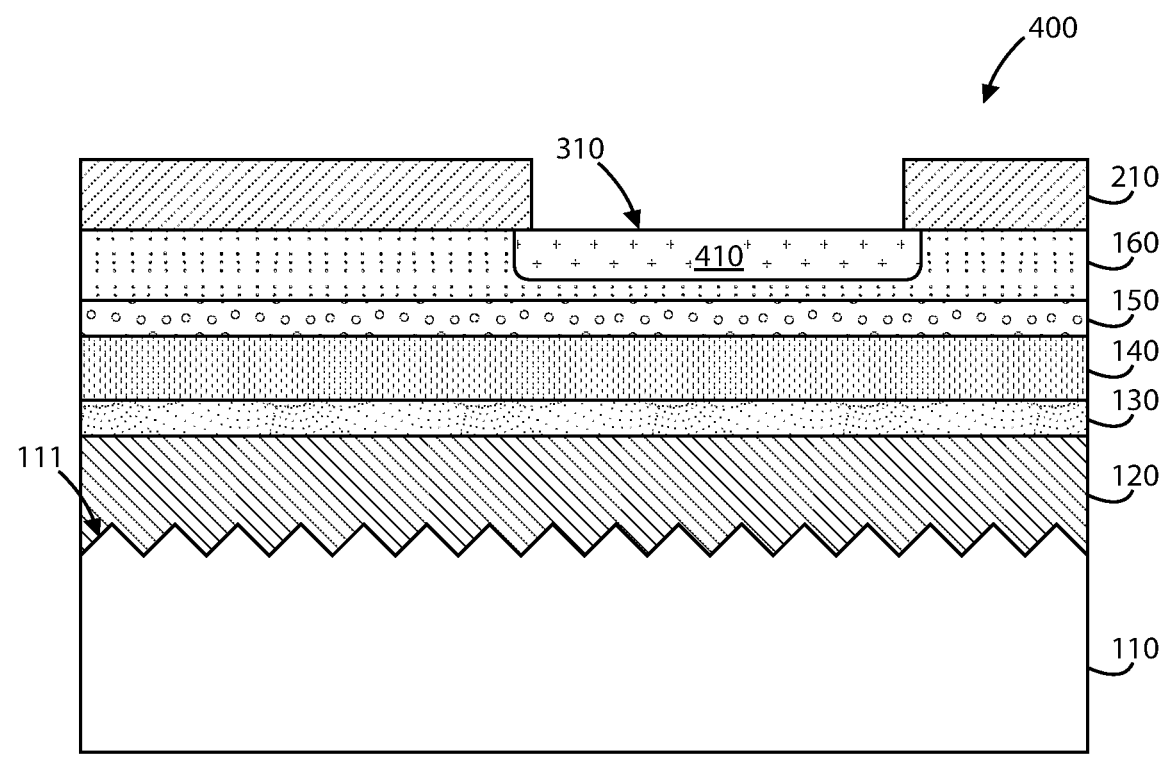

FIG. 4 is a simplified diagram illustrating an example method step of forming a p-type semiconductor region 410 using the pattern in the dielectric material, resulting in device 400. In an example, the p-type semiconductor region 410 can be formed using the dielectric pattern to introduce a p-type impurity into the UID optically transparent semiconductor material 160. This impurity introduction can include an implantation process, a diffusion process, or the like.

Depending on the specific semiconductor material used, the p-type semiconductor region 410 can be formed with diffusion of an impurity material that may be zinc, beryllium, or carbon, or the like. In a specific example, the n-type material can include an InP material with a silicon impurity having a concentration ranging from $5E17$ $cm^{-3}$ to $5E18$ $cm^{-3}$. The absorption material can include an InGaAs containing material and can be primarily (or substantially) free from any impurity. And, the p-type material can include a zinc impurity or a beryllium impurity having a concentration ranging from $5E17$ $cm^{-3}$ to $1E20$ $cm^{-3}$.

In an alternative photodetector CS device structure, the n-type material includes a GaAs material comprising an silicon impurity having a concentration ranging from $5E17$ $cm^{-3}$ to $5E18$ $cm^{-3}$, the absorption material includes an InAs quantum dot material, and the p-type material includes a zinc impurity or a beryllium impurity or a carbon impurity having a concentration ranging from $5E17$ $cm^{-3}$ to $1E20$ $cm^{-3}$.

Figure 5:
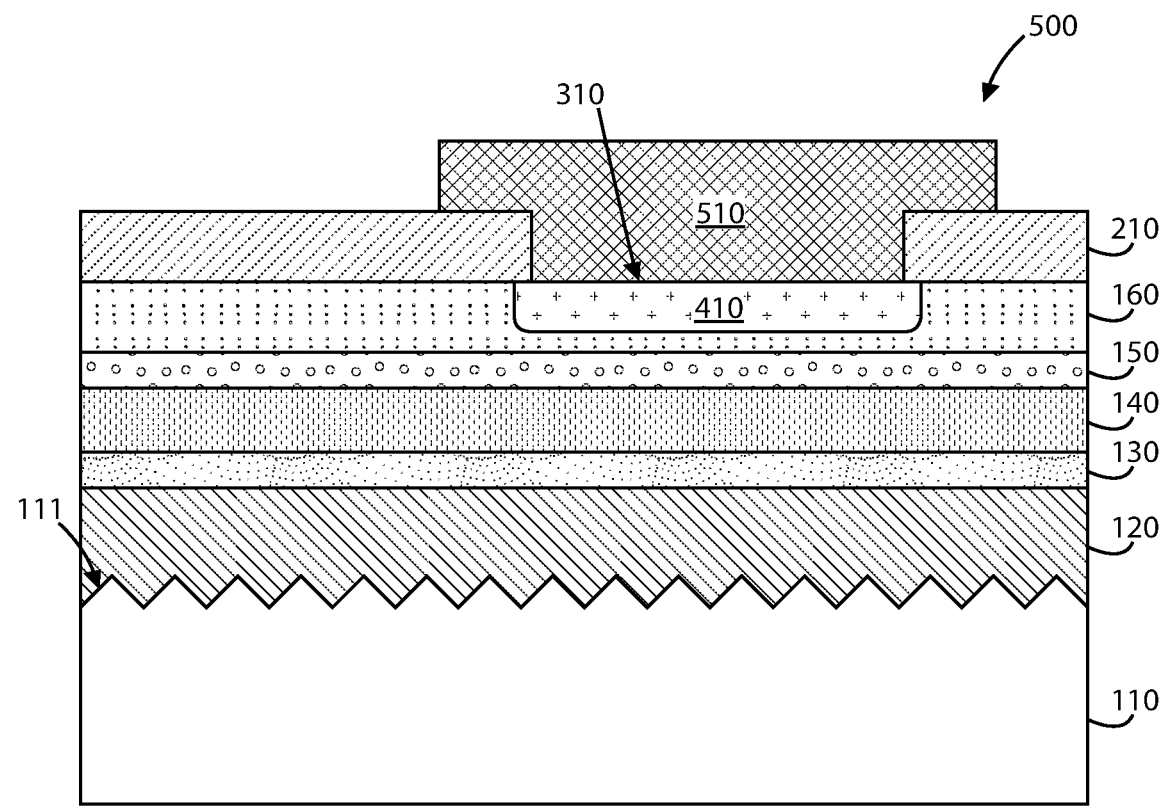

FIG. 5 is a simplified diagram illustrating an example method step of forming a p-type metal contact region 510 overlying the p-type contact region 310, resulting in device 500. In an example, the p-type metal contact region can include titanium, platinum, gold, nickel, palladium, germanium, tungsten, aluminum, zinc, or the like and combinations thereof.

Figure 6:
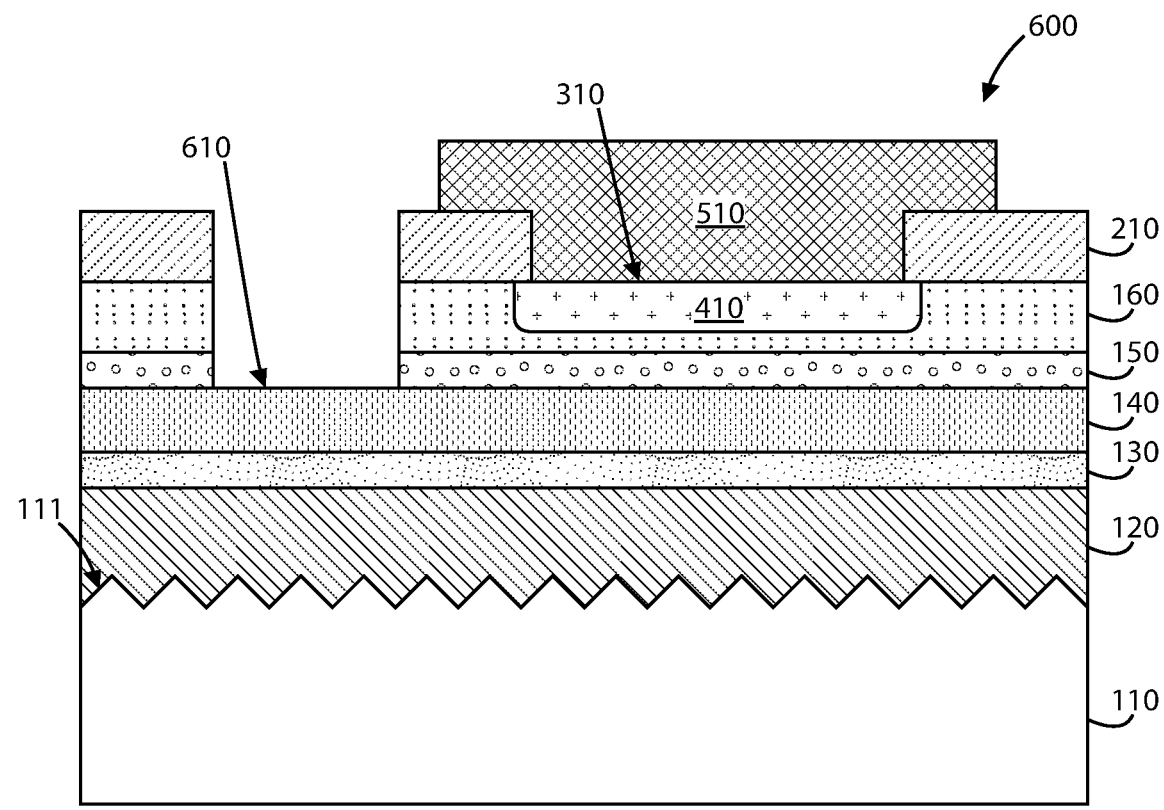

FIG. 6 is a simplified diagram illustrating an example method step of forming an n-type contact region or opening 610, resulting in device 600. This step can include etching one or more portions of the UID optically transparent semiconductor material 160, the UID optically absorptive semiconductor material 150, and the n-type semiconductor material 140 to define the n-type contact opening 610. In an example, the dielectric material can be further patterned for this n-type contact opening 610 or the pattern can already expose the underlying materials with the pattern discussed for FIG. 3. Further, each of the underlying materials (140, 150, 160) may be etched is separate steps.

Figure 7:
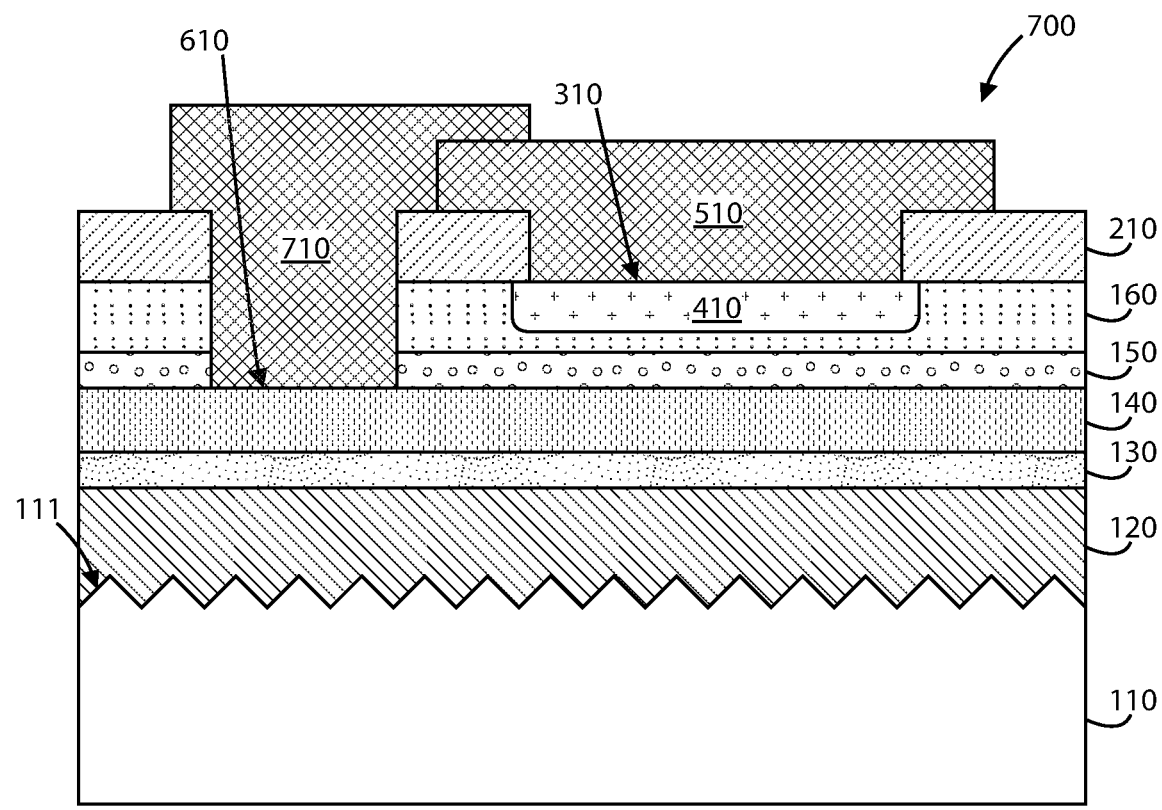

FIG. 7 is a simplified diagram illustrating an example method step of forming an n-type metal contact region 710 within the previously etched portions to form a common n-type electrode, resulting in device 700. As shown, the n-type metal contact region 710 is formed overlying the n-type contact opening 610 and a portion of the p-type metal contact region 510. This connects the p-type metal contact region 510 to the n-type semiconductor material 140, which creates a common n-type electrode with any other sensor element configured within the same device (see FIG. 9).

Figure 8:
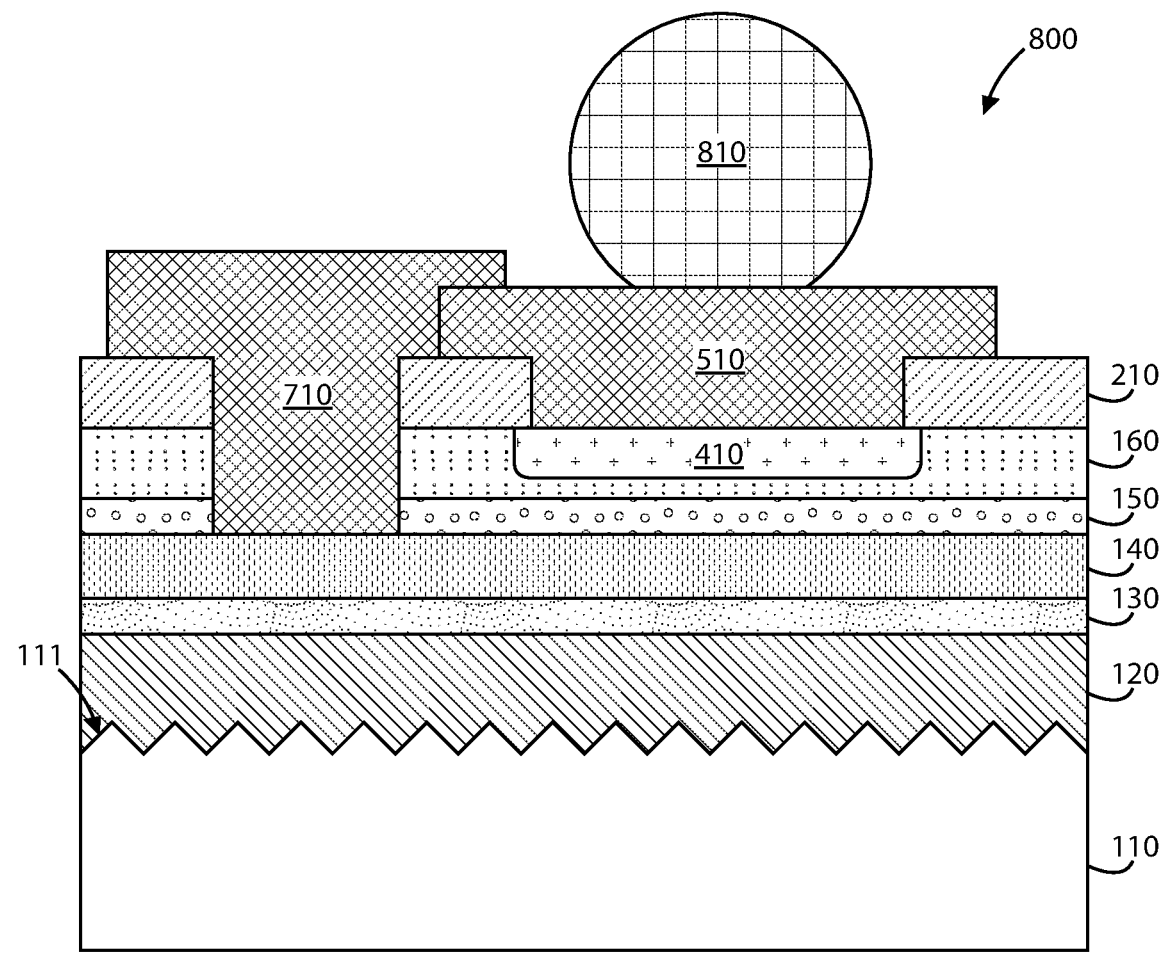

FIG. 8 is a simplified diagram illustrating an example method of forming a bump material 810 overlying the p-type metal contact region 510, resulting in device 800. In an example, the solder bump material 810 can include solder, gold, conductive epoxy, copper, or the like.

Figure 9:
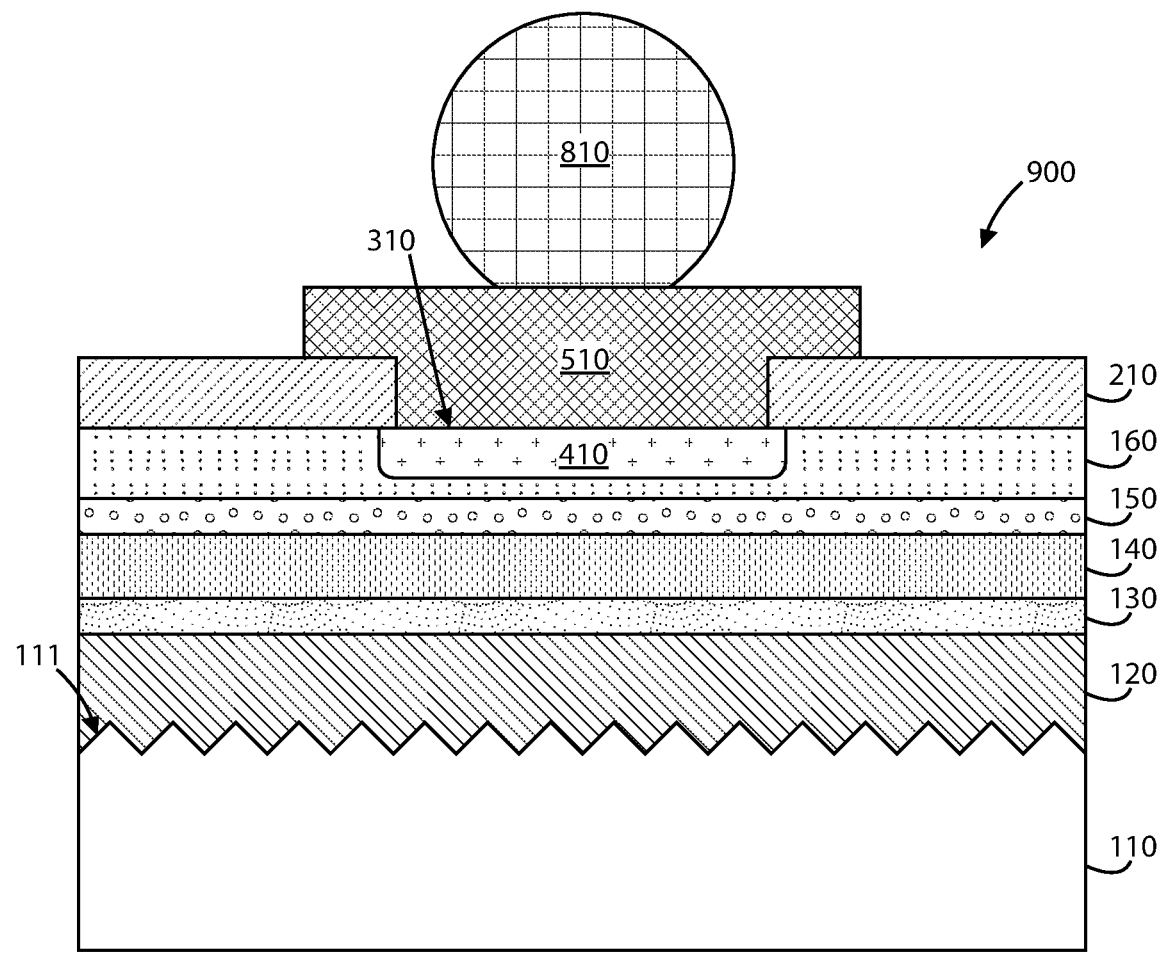
FIG. 9 is a simplified diagram of a sensor device according to an example of the present invention.

FIG. 9 is a simplified diagram illustrating a sensor device 900 according to an example of the present invention. As shown, device 900 includes an example sensor element with the bump material 810 shown in FIG. 8, but without the n-type contact opening 610 and n-type metal contact region 710 shown in FIGS. 6 and 7. These sensor elements can be configured on the same device as the sensor elements shown in FIG. 8 such that the common n-type electrode of device 800 serves as the n-type electrode for device 900.

Figure 10:
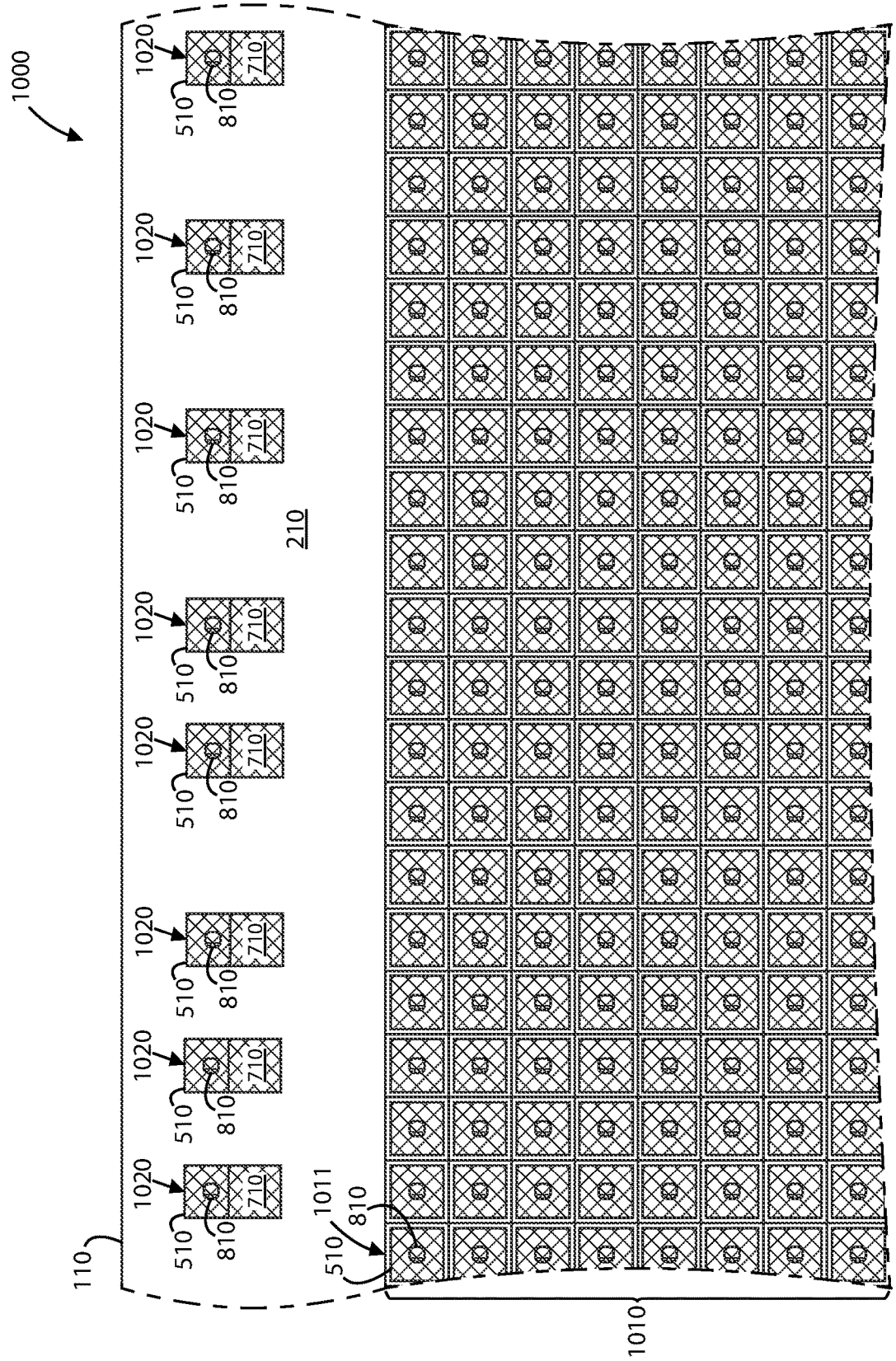
FIG. 10 is a simplified diagram of a sensor array device according to an example of the present invention.

FIG. 10 is a simplified diagram illustrating a portion of a sensor array device 1000 (hidden portions denoted by the dotted lines) according to an example of the present invention. As shown, the sensor array device 1000 includes a pixel array region 1010 of first sensor elements 1011. These first sensor elements 1011 can include devices similar the device 900 shown in FIG. 9, including a p-type metal contact region 510 with an overlying bump material 810. These first sensor elements 1011 can be pixel elements configured within a center portion of the silicon substrate (or partially completed semiconductor substrate).

In an example, the pixel array region 1010 can include one or more isolation trenches separating each of the pixel elements. Also, each of these pixel elements can have a characteristic length ranging from 0.3 micrometers to 50 micrometers.

The array device 1000 can also include one or more second sensor elements 1020, shown to be separated from the first sensor elements 1011 by the dielectric material 210. These second sensor elements 1020 can include devices similar to device 800 shown in FIG. 8, including a p-type metal contact region 510, an n-type metal contact region 710, and a bump material 810. Also, these second sensor elements 1020 can be configured on an exterior region of the silicon substrate (or partially completed semiconductor substrate). As discussed previously, the n-type and p-type metal contact regions of the second sensor elements 1020 can form a common n-type electrode. Thus, these second sensor elements 1020 can be configured as cathode regions in which each of the cathode regions are connected to each other to form a common cathode element.

Alternatively, the first sensor elements 1011 can have n-type metal contact regions (i.e., flipping the n-type and p-type materials) and the second sensor elements 1020 can be configured as common p-type electrodes. Thus, the second sensor elements 1020 would be configured as anode regions in which each of the anode regions are connected to each other to form a common anode element. Those of ordinary skill in the art will recognize other variations, modifications, and alternatives to these steps.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear devices for optical comb or frequency generation. Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), and uni-traveling-carrier (UTC) photodiodes.

The optoelectronic devices and device arrays realized with deposition of semiconductor materials on Si can be leveraged in various applications, including, but not limited to, LIDAR; LIDAR for autonomous vehicles including, but not limited to, automobiles, aerial vehicles, airplanes, jets, drones, robotic vehicles; advanced driver assistance systems (ADAS); LIDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) imaging; smart building, security, people counting; thermal imaging, thermography; heating, and ventilation and air conditioning (HVAC).

FIGS. 11A to 11J are simplified diagrams illustrating a method of fabricating a sensor device according to an example of the present invention. In these figures, shared reference numerals in subsequent figures refer to the same elements as described in previous figures. Further, with regard to the method discussed below, steps may be added, removed, rearranged, or combined depending upon the application.

Figure 11A:
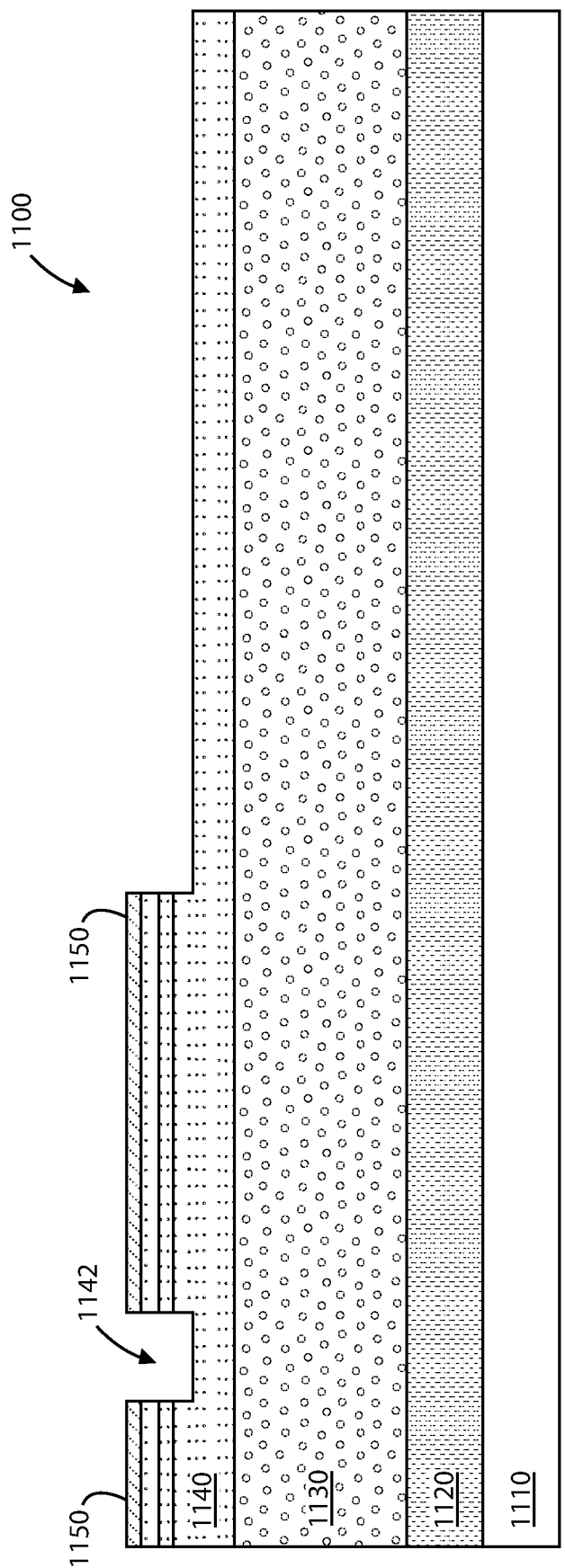
FIGS. 11A to 11J are simplified diagrams illustrating a method of fabricating a sensor device according to an example of the present invention.

FIG. 11A is a simplified diagram illustrating a cross-sectional view of a method step of etching the sensor device 1100 according to an example of the present invention. As shown, device 1100 includes a substrate 1110 with photodetector device materials 1120-1140 formed overlying. These device materials include at least an n-type semiconductor material 1120, a transition material 1130, and a UID optically transparent semiconductor material 1140, respectively. Further, a first dielectric material 1150 is formed overlying at least a portion of the transparent semiconductor material 1140. These materials can include the respective material compositions discussed for previous figures. Here, the method step includes etching one or more portions of the first dielectric material 1150 and the transparent semiconductor material 1140, which includes forming a trench region 1142 within a portion of the transparent semiconductor material 1140. In a specific example, the etching process can include an inductively coupled plasma (ICP) dry etching process, a reactive ion etching (RIE) process, or the like.

Figure 11B:
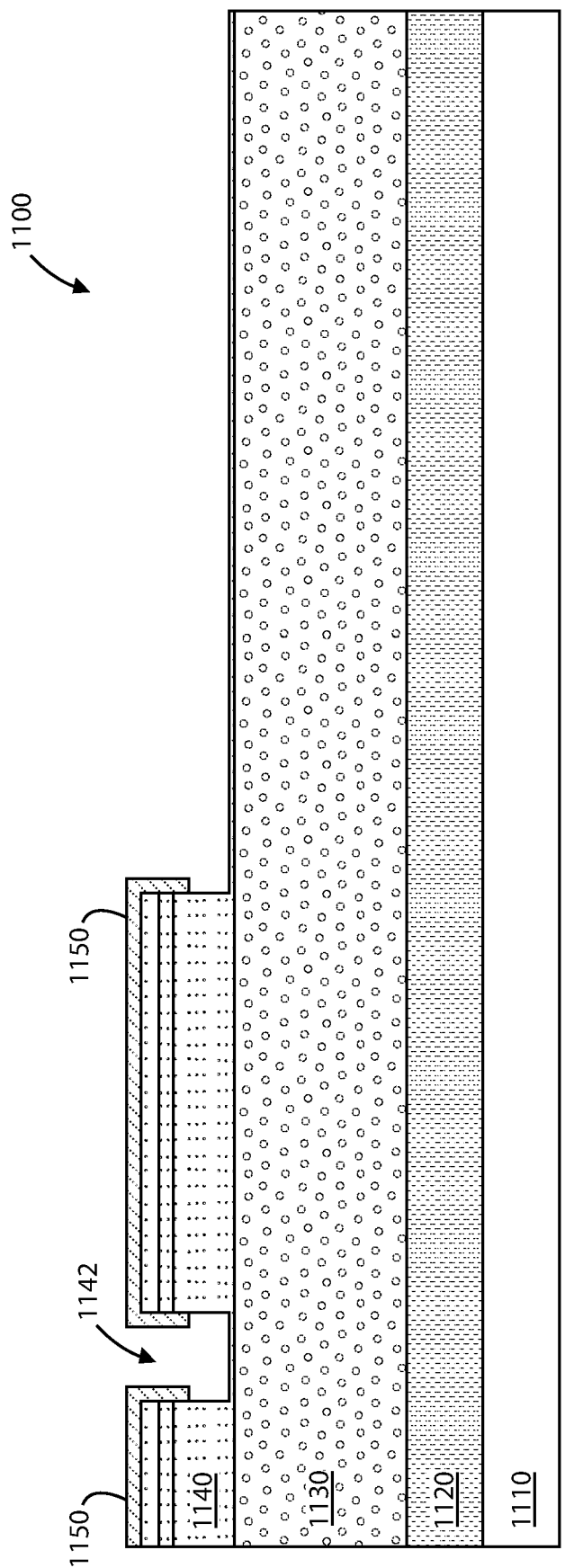

FIG. 11B is a simplified diagram illustrating a cross-sectional view of a method step of etching the sensor device 1100 according to an example of the present invention. As shown, the device 1100 is further etched to removes one or more portions of the transparent semiconductor material 1140, including deepening the trench region 1142. The etching processes can include dry etching (e.g., ICP, RIE, etc.) or wet etching processes. Further, first dielectric materials 1150 can be formed to extend around the edges of the unetched portions of the transparent semiconductor material 1140 and within a portion of the trench region 1142.

Figure 11C:
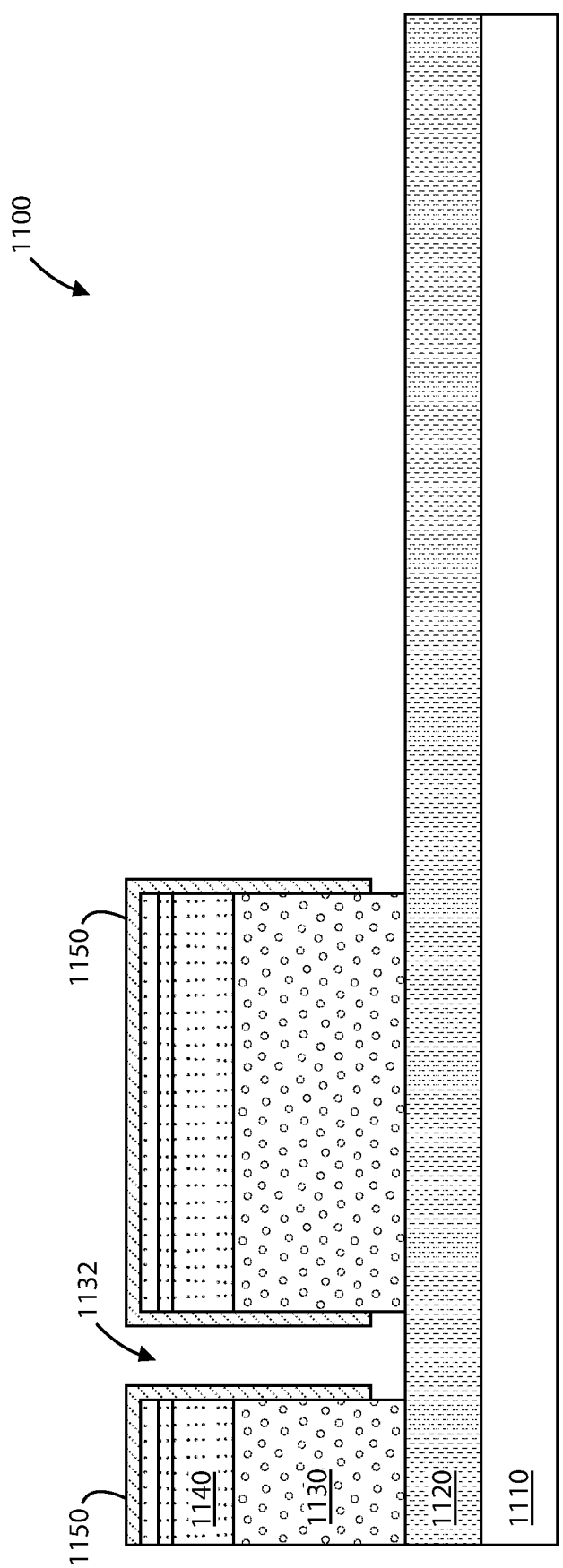

FIG. 11C is a simplified diagram illustrating a cross-sectional view of a method step of etching the sensor device 1100 according to an example of the present invention. As shown, the device 1100 is further etched to remove one or more portions of the transition material 1130, including deepening the trench region 1142 to form the trench region 1132. Further, first dielectric materials 1150 can be formed to extend around the edges of the unetched portions of the transparent semiconductor material 1140 and the transition material 1130, as well as within a portion of the trench region 1132.

Figure 11D:
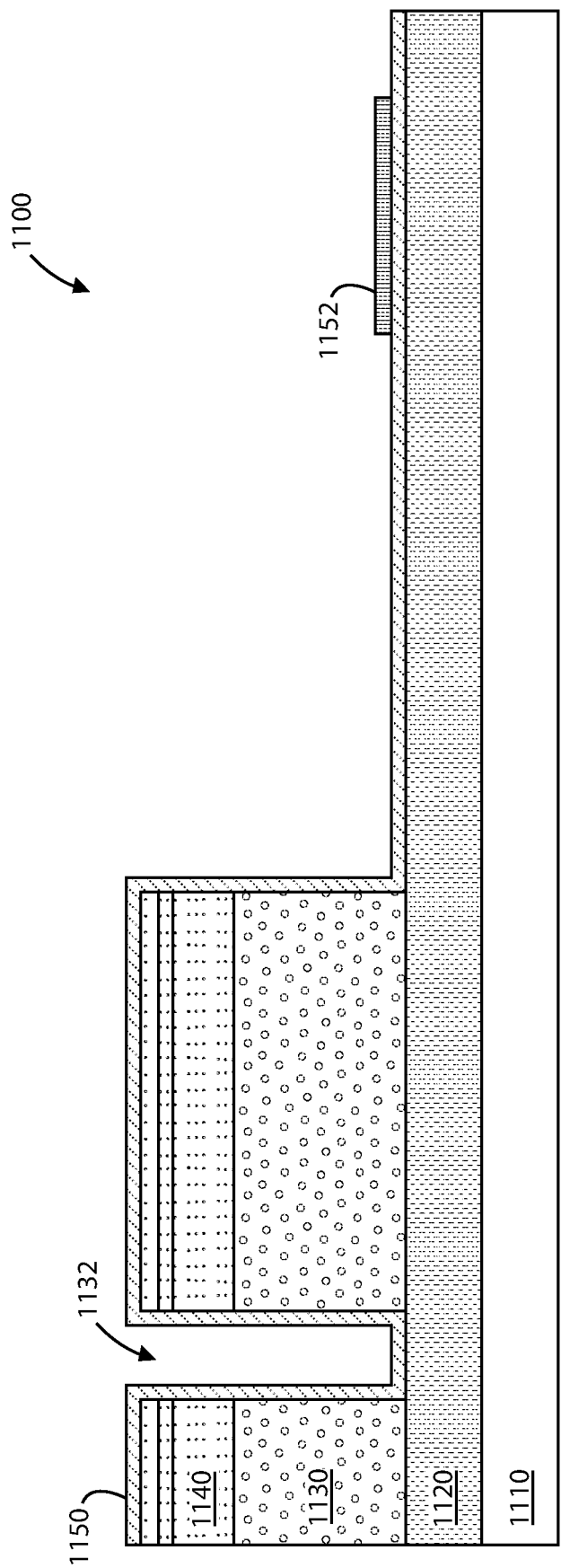

FIG. 11D is a simplified diagram illustrating a cross-sectional view of a method step of forming dielectric materials 1150 and a mask region 1152 overlying a portion of the sensor device 1100 according to an example of the present invention. As shown, the method step includes forming dielectric materials 1150 overlying the device 1100 and forming the mask region 1152 overlying at least a portion of the first dielectric material 1150 and the n-type material 1120. This portion can be a region where portions of the transition material 1130 and transparent semiconductor material 1140 were removed by previous etching processes.

Figure 11E:
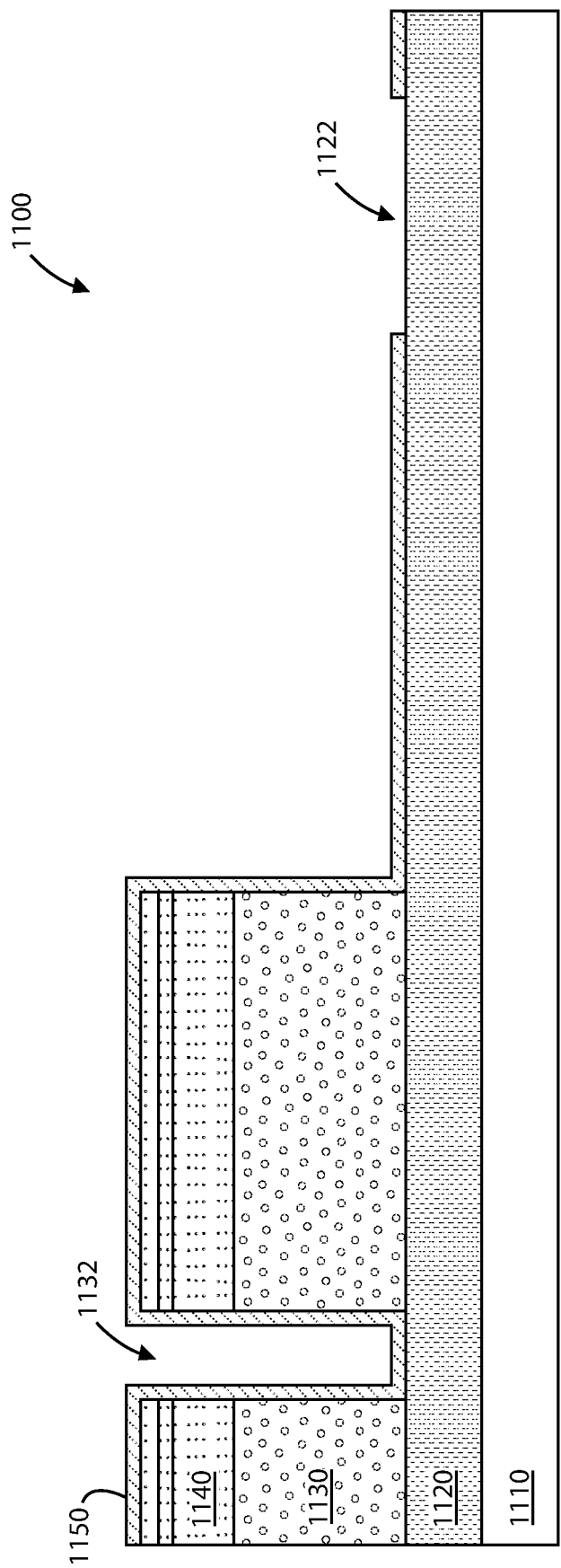

FIG. 11E is a simplified diagram illustrating a cross-sectional view of a method step of etching the sensor device 1100 according to an example of the present invention. As shown, the device 1100 is etched to form an opening within the first dielectric material 1150 defined by the mask region 1152. This mask region 1152 is used to define a first active region 1122 that will become a cathode contact region.

Figure 11F:
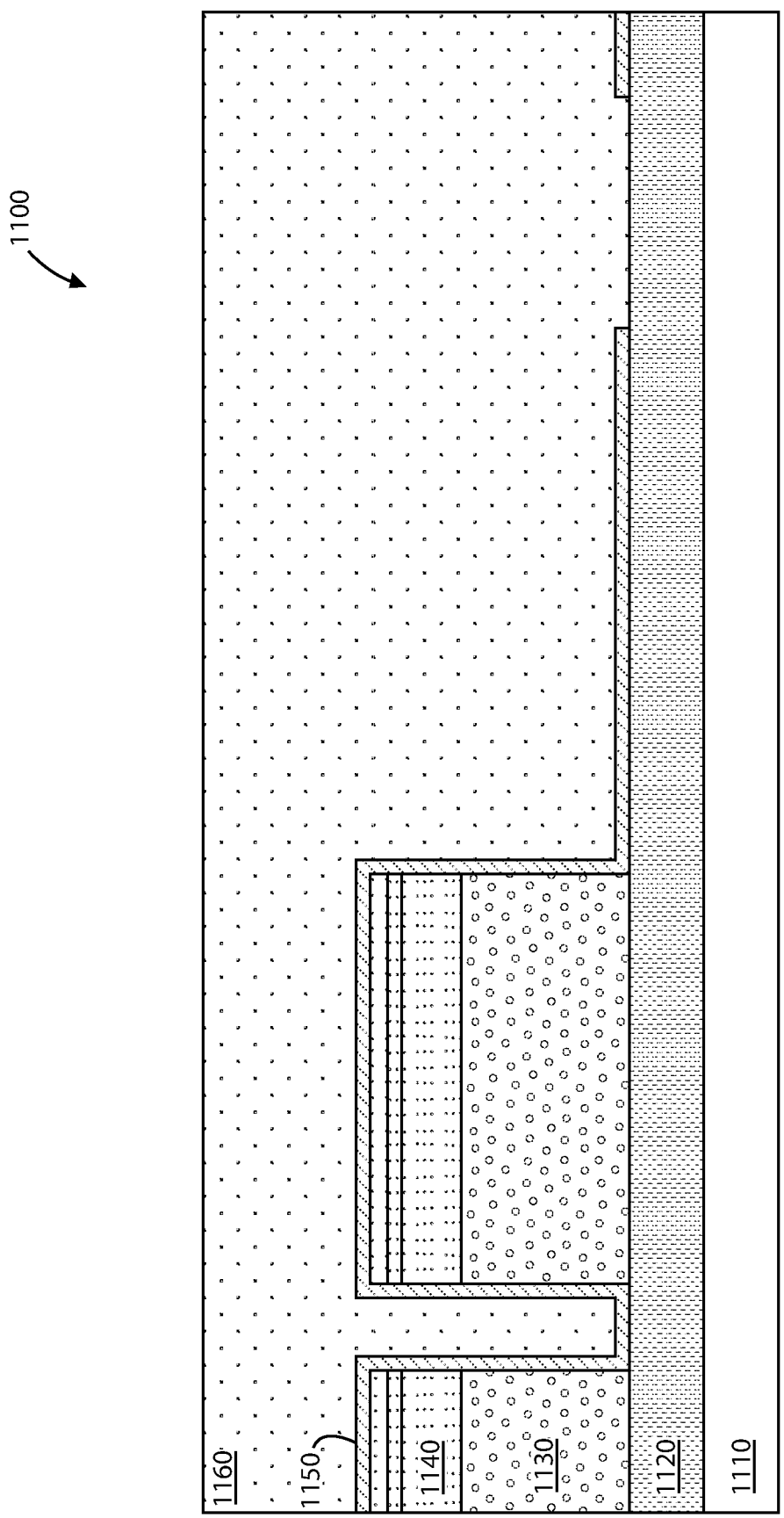

FIG. 11F is a simplified diagram illustrating a cross-sectional view of a method step of forming a second dielectric material 1160 overlying the sensor device 1100 according to an example of the present invention. As shown, the second dielectric material 1160 is formed overlying the first dielectric material 1150 and the active region 1122 (shown in FIG. 11E). Also, the device 1100 is subjected to a planarization process to smooth the top surface region of the second dielectric material 1160. In a specific example, the second dielectric material includes a silicon dioxide material, or the like. Also, the planarization process includes a chemical-mechanical planarization (CMP) process, or the like.

Figure 11G:
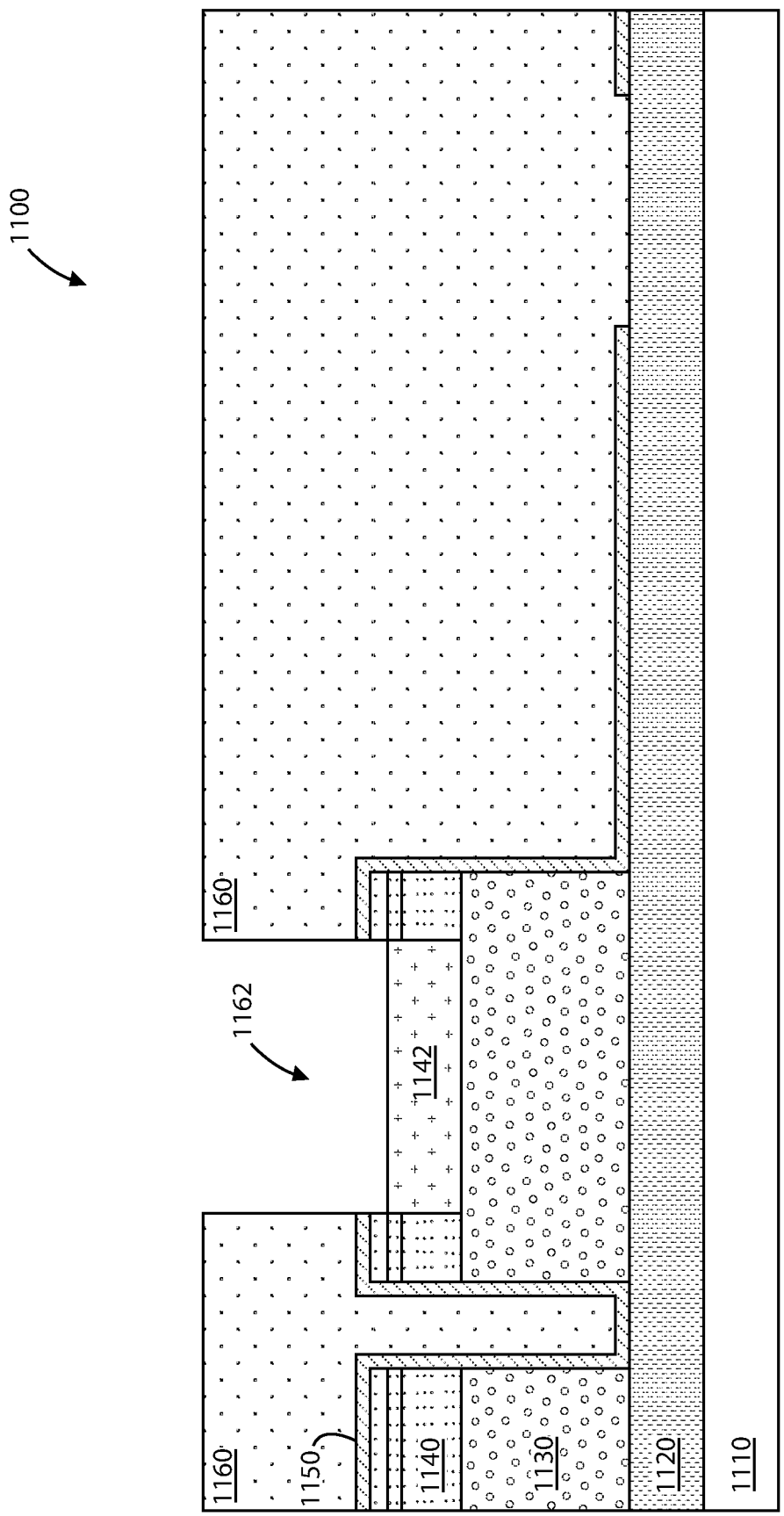

FIG. 11G is a simplified diagram illustrating a cross-sectional view of a method step of etching the sensor device 1100 and forming a p-type region 1142 according to an example of the present invention. As shown, the device 1100 is etched to form a first contact trench region 1162, which includes etching portions of the second dielectric material 1160 and the first dielectric material 1150. In a specific example, this etching process can include a wet etching process, or the like. Then, the p-type region 1142 (i.e., the second active region) is formed within a portion of the transparent semiconductor material 1140. This p-type region formation can include the materials and processes discussed for previous figures. In a specific example, the p-type region 1142 can be formed by Zn diffusion.

Figure 11H:
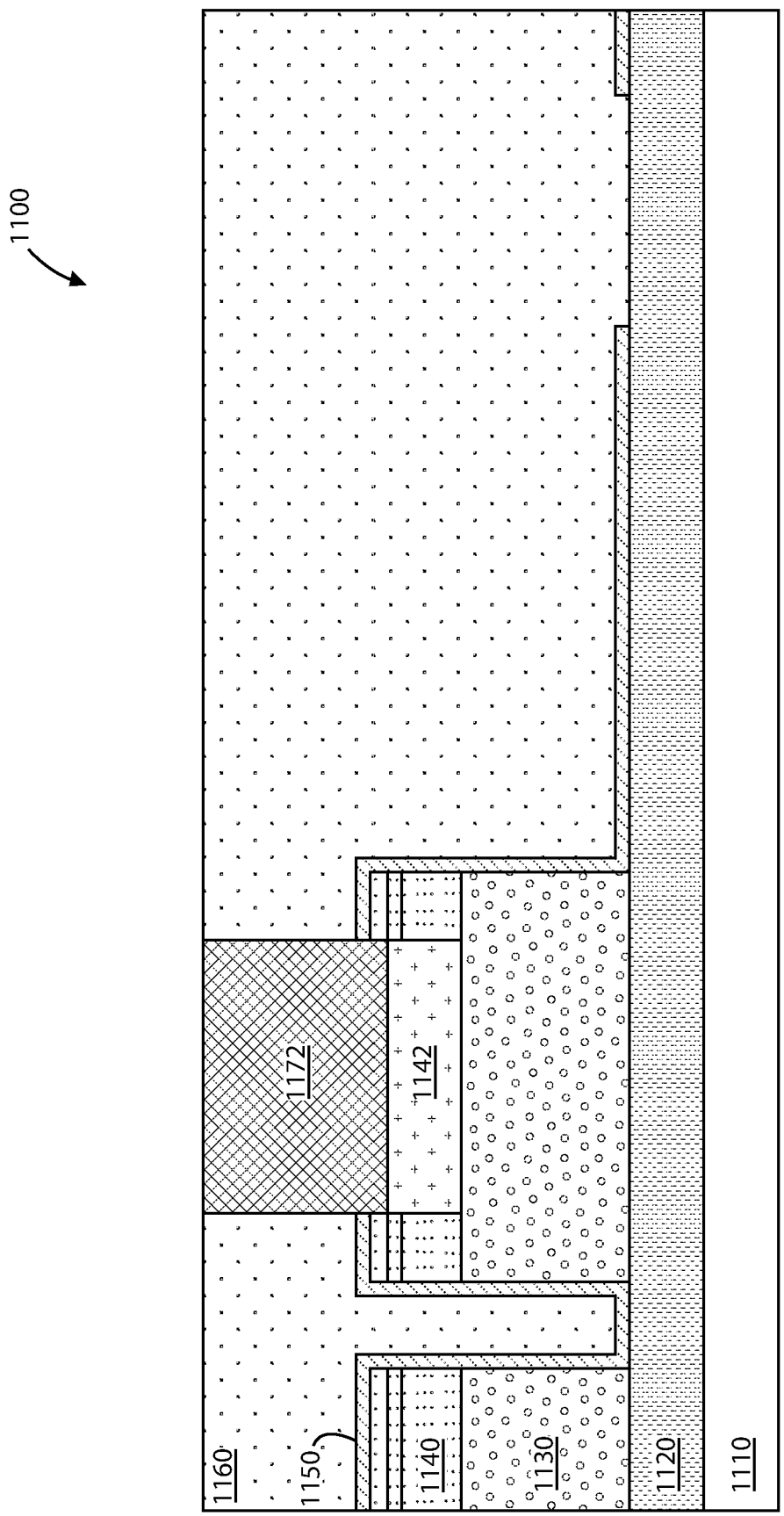

FIG. 11H is a simplified diagram illustrating a cross-sectional view of a method step of forming a p-type contact region within the sensor device 1100 according to an example of the present invention. As shown, a first metal contact material 1172 is formed within the first contact trench region 1162 (see FIG. 11G) overlying the p-type region 1142.

Figure 11I:
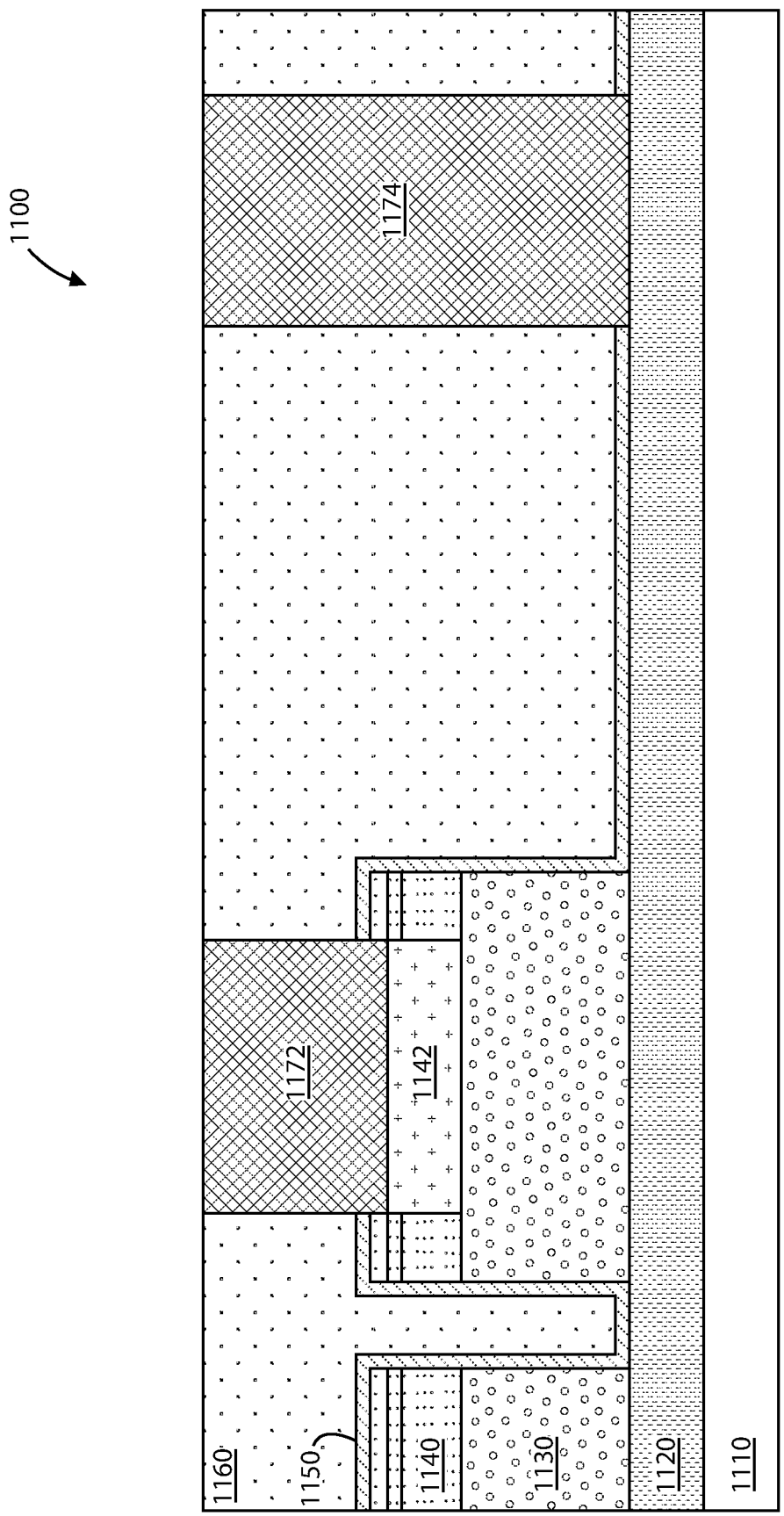

FIG. 11I is a simplified diagram illustrating a cross-sectional view of a method step of forming an n-type contact region within the sensor device 1100 according to an example of the present invention. As shown, the method includes forming a second metal contact material 1174 overlying the first active region 1122 of the n-type material 1120. Similar to the previous step, this formation process can include etching a second contact trench region overlying the first active region 1122 before forming the second metal contact material 1174.

Figure 11J:
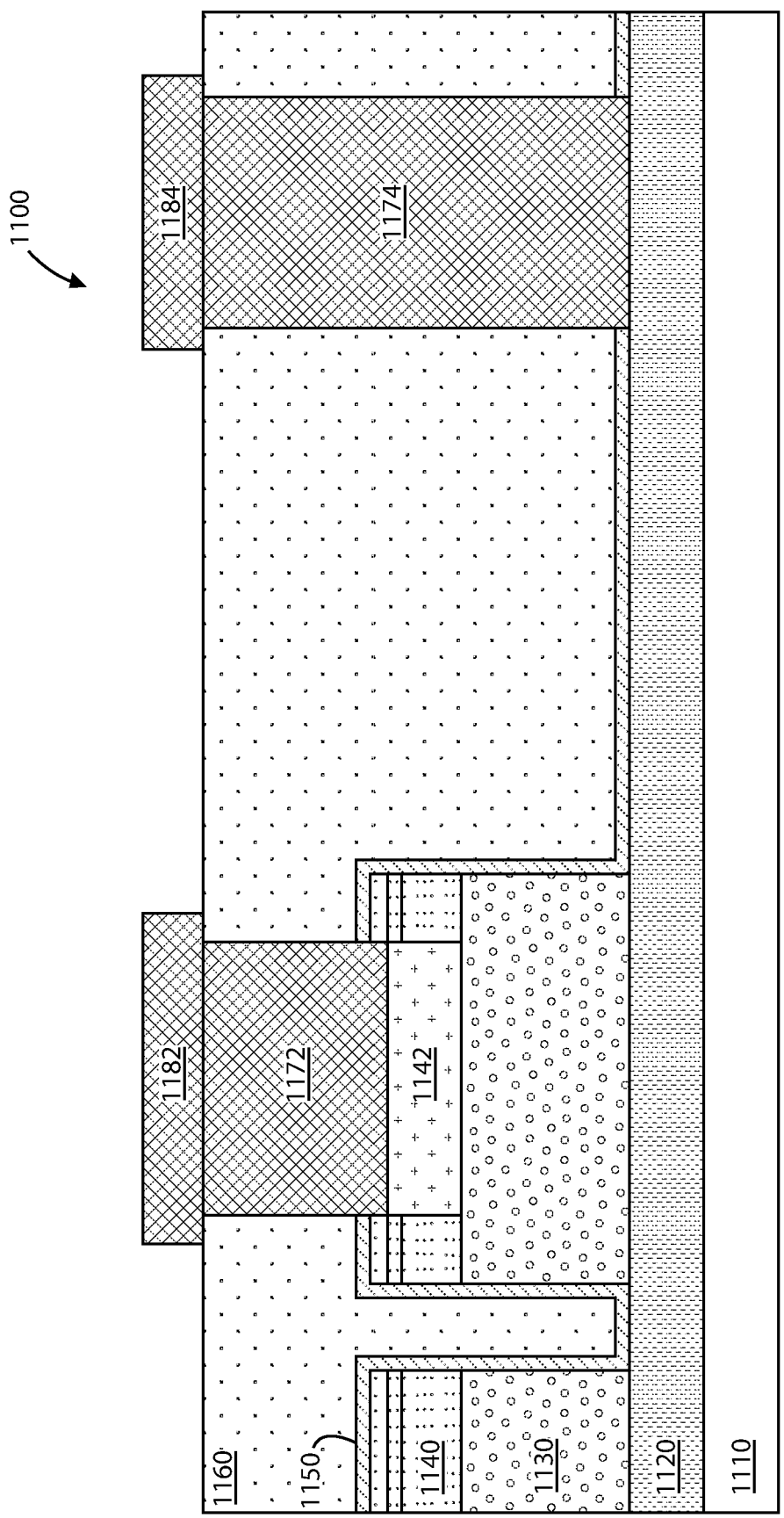

FIG. 11J is a simplified diagram illustrating a cross-sectional view of a method step of bond pads for the sensor device 1100 according to an example of the present invention. As shown, a first bond pad 1182 is formed overlying the first metal contact material 1172 and second bond pad 1184 is formed overlying the second metal contact material 1174. Here, the first bond pad 1182 is configured as a p-type bond pad, and the second bond pad 1184 is configured as an n-type bond pad.

In these method steps, the etching processes can include wet etching, dry etching, or other similar processes. Also, the masking processes can include optical lithography, electron beam lithography, soft lithography, direct write lithography, or the like. Those of ordinary skill in the art will recognize other variations, modifications, and alternatives to the steps described previously.

Figure 12A:
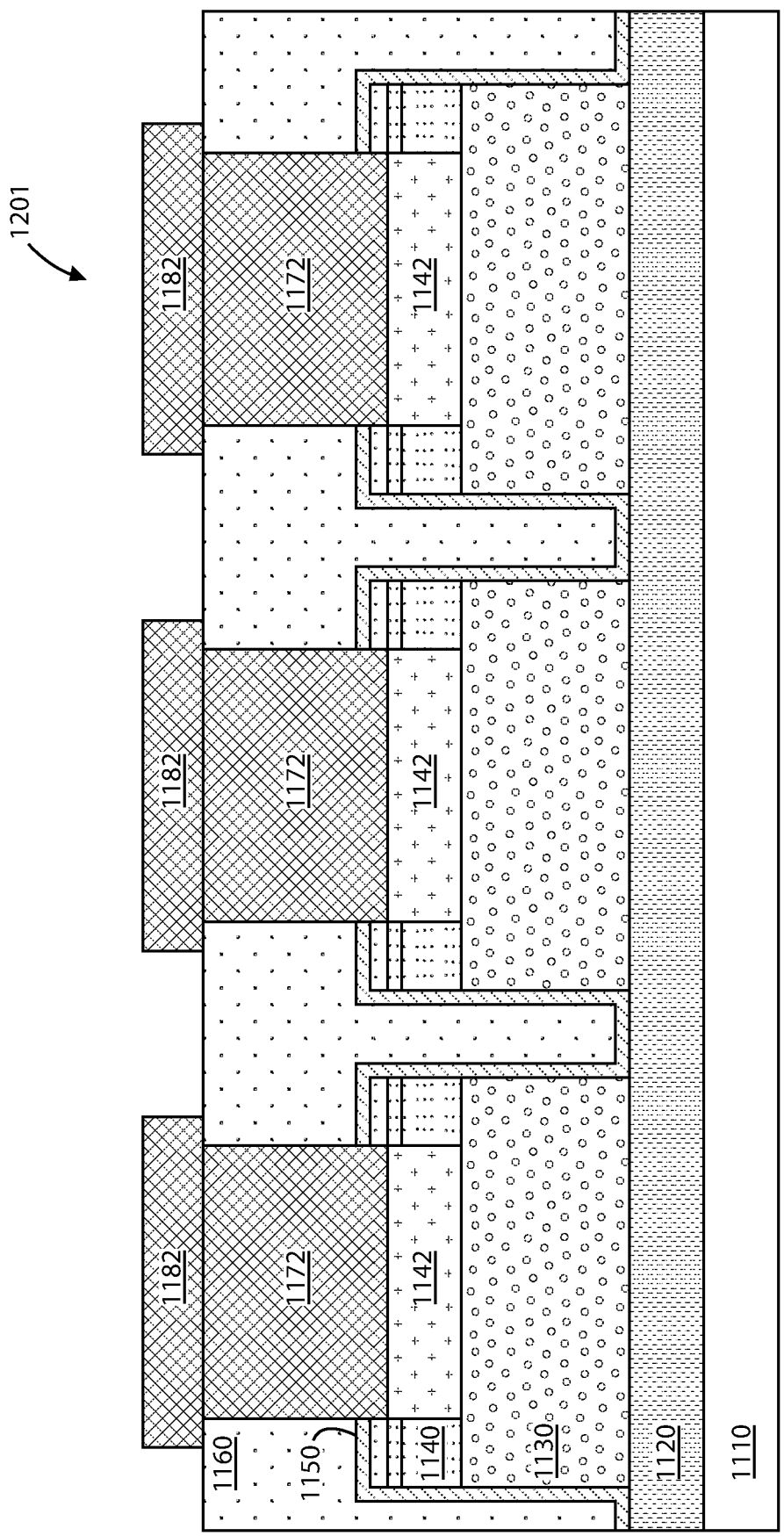
FIGS. 12A to 12B are simplified diagrams illustrating a sensor array device according to examples of the present invention.
Figure 12B:
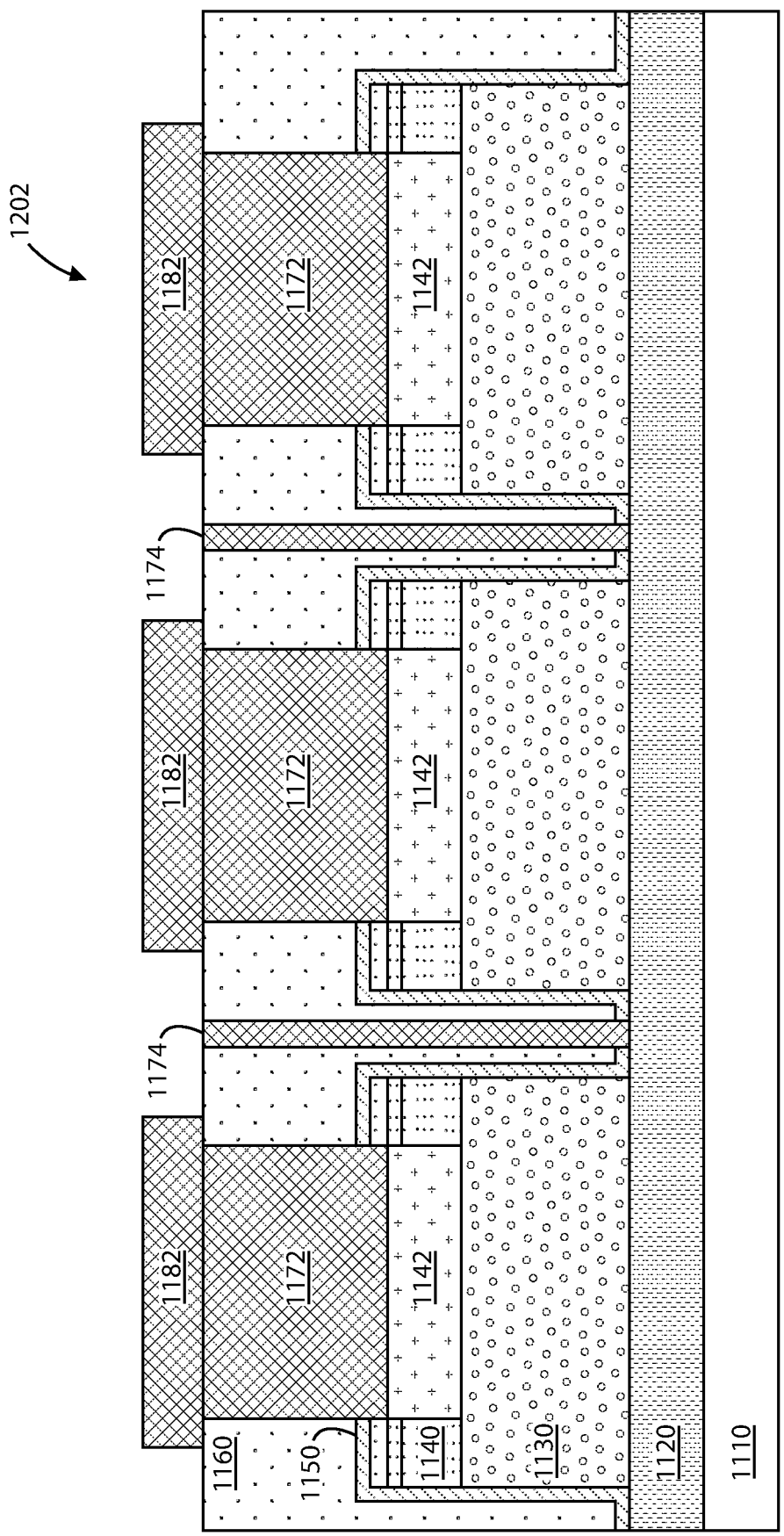

FIGS. 12A to 12B are simplified diagrams illustrating a sensor array device with device isolation according to examples of the present invention. In these figures, shared reference numerals in subsequent figures refer to the same elements as described in previous figures. Further, with regard to the device discussed below, materials and components discussed for previous examples of the present invention may be included here as well.

FIG. 12A is a simplified diagram illustrating a cross-sectional view of a sensor array device 1201 according to an example of the present invention. As shown, three sensor devices are configured next to each other while being separated by trenches (similar to trench 1132 in FIG. 11D). These sensor devices are similar to the sensor device 1100 shown previously in FIGS. 11A to 11J, but without the n-type contact region.

FIG. 12B is a simplified diagram illustrating a cross-sectional view of a sensor array device 1202 according to an example of the present invention. Similar to FIG. 12A, three sensor devices are configured next to each other while being separated by trenches. However, in this case, second metal contact materials 1174 are spatially configured within the trench regions extending to the top of the second dielectric material 1160. These contact materials 1174 may be configured to isolate the sensor devices from each other (e.g., pixel isolation).

Figure 13:
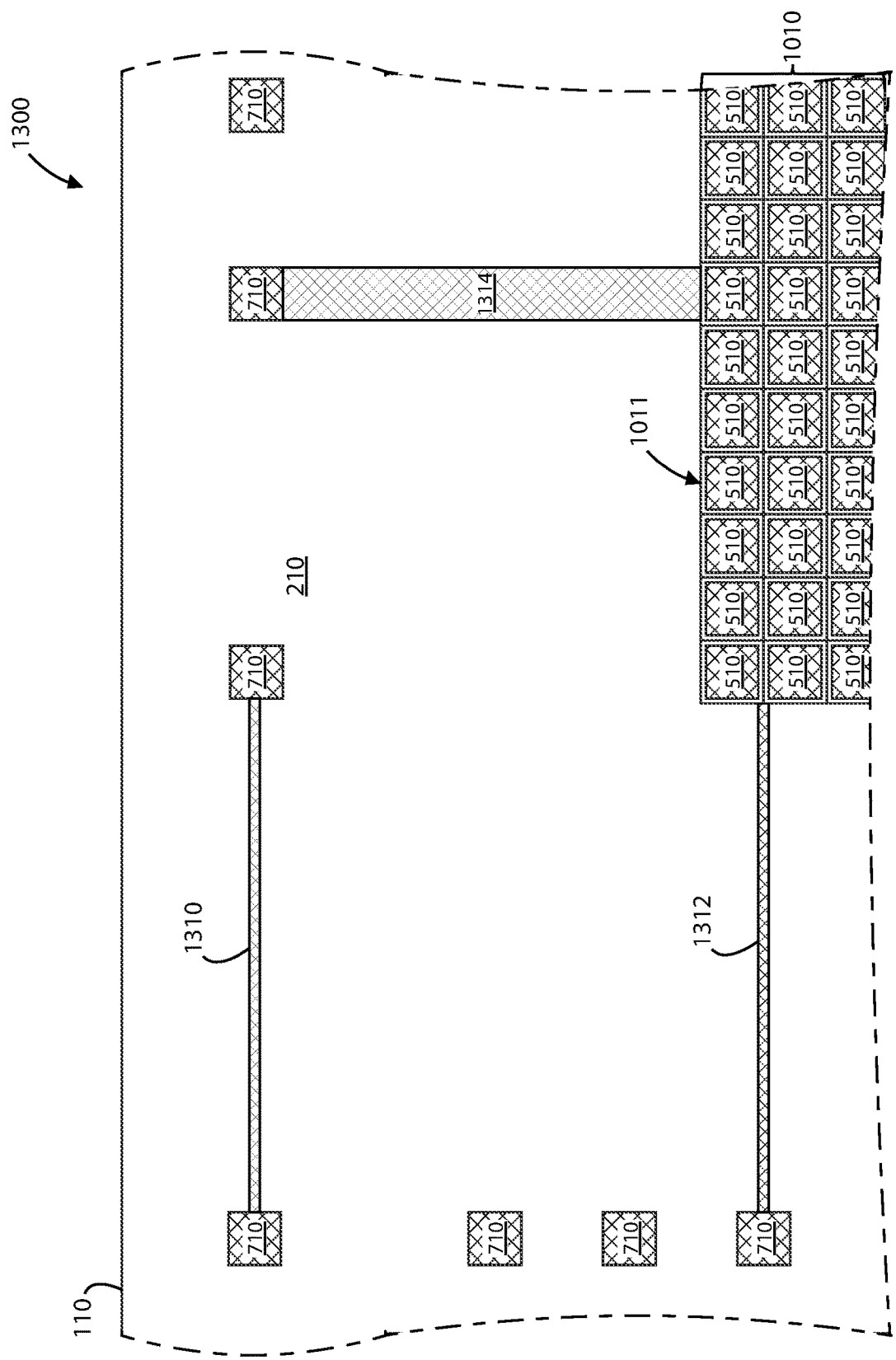
FIG. 13 is a simplified diagram illustrating a sensor array device with device isolation according to an example of the present invention.

FIG. 13 is a simplified diagram illustrating a sensor array device using metalized trenches according to an example of the present invention. In these figures, shared reference numerals in subsequent figures refer to the same elements as described in previous figures. Further, with regard to the device discussed below, materials and components discussed for previous examples of the present invention may be included here as well.

As shown, the sensor array device 1300 includes n-type metal contact regions 710 and a pixel array region 1010 of first sensor elements 1011 with p-type metal contact regions 510. In an example, metalized trenches may be used to connect to the n-type metal contact regions 710 wherever needed. The metalized trench 1310 is coupled between two n-type contacts 710, while the metalized trench 1312 is coupled between an n-type contact 710 and the array 1010. A thicker metalized trench 1314 is coupled between another n-type contact 710 and the array 1010. These metalized trenches can be configured to increase the current spread uniformity across the whole array 1010. Further details are discussed with respect to FIGS. 14A to 14B.

Figure 14A:
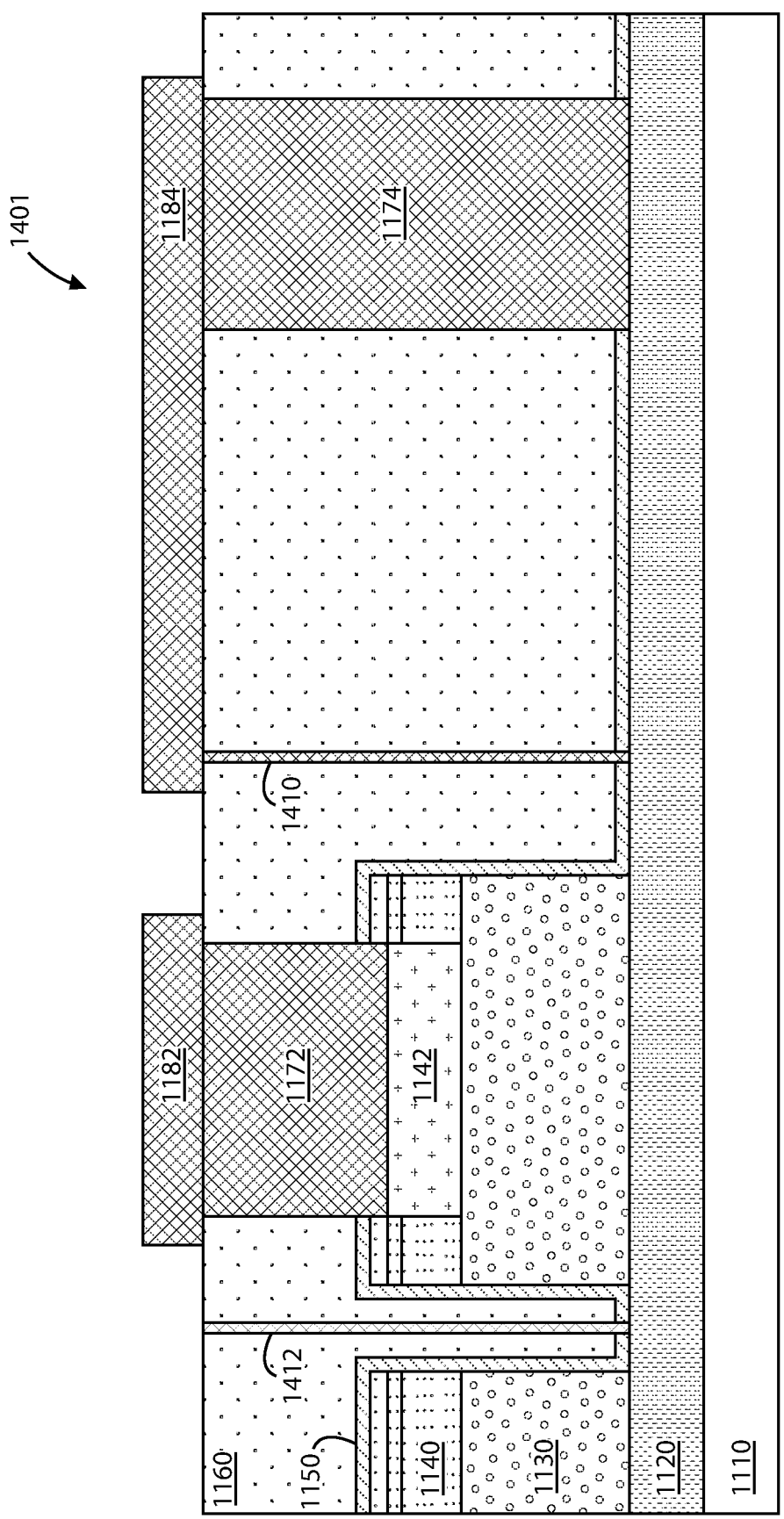
FIGS. 14A to 14B are simplified diagrams illustrating a sensor device using metalized trenches according to examples of the present invention.
Figure 14B:
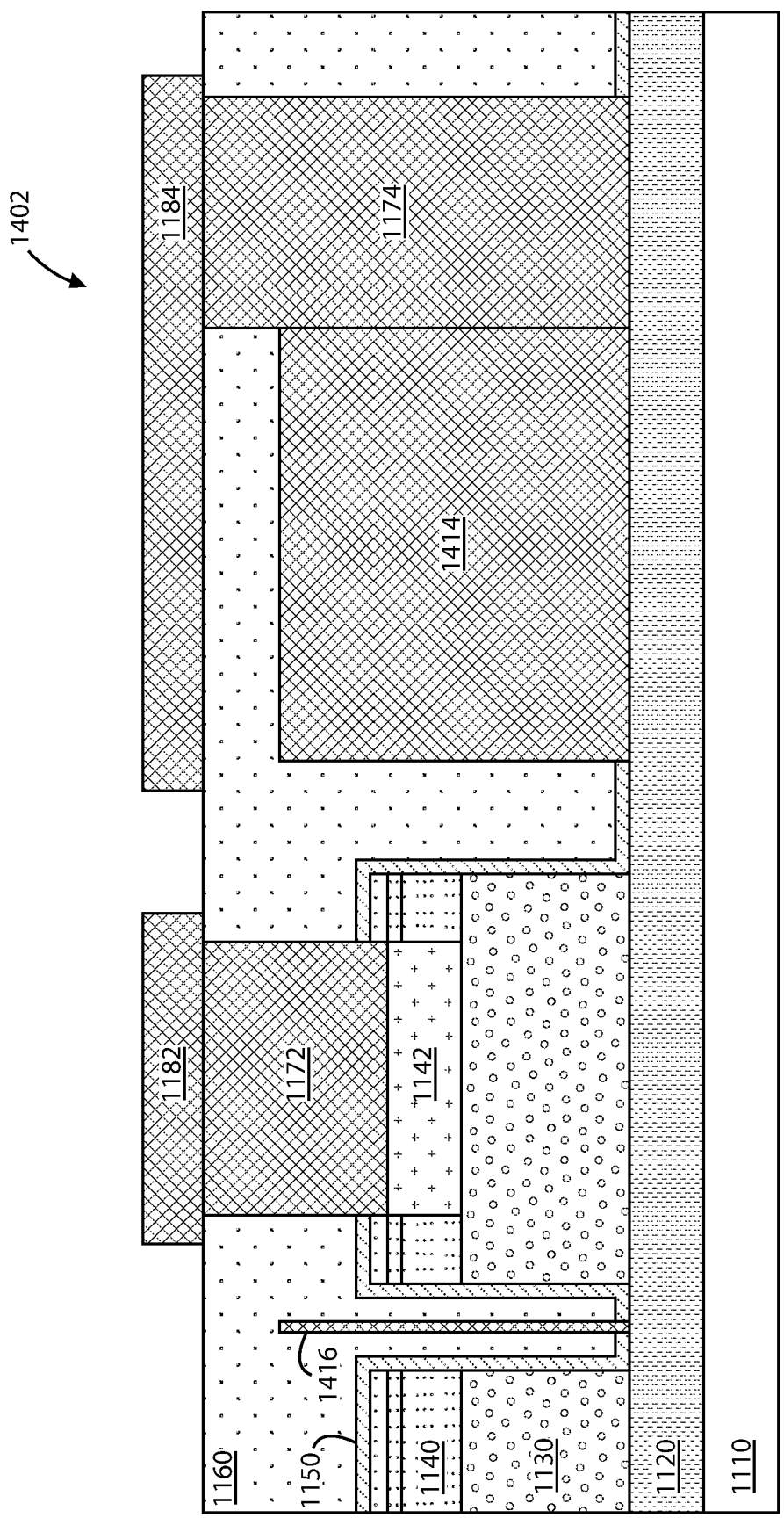

FIGS. 14A to 14B are simplified diagrams illustrating a sensor device using metalized trenches according to examples of the present invention. In these figures, shared reference numerals in subsequent figures refer to the same elements as described in previous figures. Further, with regard to the device discussed below, materials and components discussed for previous examples of the present invention may be included here as well.

FIG. 14A is a simplified diagrams illustrating cross-sectional view of a sensor device 1401 with a metalized trench according to an example of the present invention. This device 1401 is similar to device 1100 except that the second bond pad 1184 is extended across a portion of the second dielectric material 1160 closer to the first bond pad 1182 and there is an additional trench with a third metal contact material 1410 extending from the second bond pad 1184 to the n-type semiconductor material 1120. Also, a fourth metal contact material 1412 is configured within the trench on the other side that extends from the n-type semiconductor material 1120 to the top of the second dielectric material 1160.

FIG. 14B is a simplified diagrams illustrating cross-sectional view of a sensor device 1402 with a metalized trench according to an example of the present invention. This device 1401 is similar to device 1100 except that the second bond pad 1184 is extended across a portion of the second dielectric material 1160 closer to the first bond pad 1182 and there is an a third metal contact material 1414 configured within a portion of the second dielectric material 1160 underlying the second bond pad 1184 and coupled to both the n-type semiconductor material 1120 and the second metal contact material 1174. Also, a fourth metal contact material 1416 is configured within the trench on the other side that extends from the n-type semiconductor material 1120 to a portion of the second dielectric material 1160 below the top surface. Those of ordinary skill in the art will recognize variations, modifications, and alternatives to these isolation configurations for electrical uniformity.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method for fabricating a sensor device, the method comprising:
   providing a partially completed semiconductor substrate comprising a silicon substrate, a buffer material overlying the silicon substrate, an n-type semiconductor material overlying the buffer material, an unintentionally doped (UID) optically absorptive semiconductor material overlying the n-type semiconductor material, and a p-type semiconductor material overlying the UID optically absorptive semiconductor material, and a native insulating material overlying the p-type semiconductor material;
   placing the partially completed semiconductor substrate into a first carrier device, the first carrier device being sealed and maintained in a predetermined environment, the predetermined environment including a nitrogen containing material;

transferring the first carrier device, including the partially completed semiconductor substrate from a first geographic location to a second geographic location;

transferring the partially completed semiconductor substrate from the first carrier device to a second carrier device;

cleaning the partially completed semiconductor substrate;

forming a dielectric material overlying a surface region of the partially completed semiconductor substrate;

forming a p-type contact region overlying a first portion of the surface region to define a pattern in the dielectric material;

forming a p-type metal contact region overlying the p-type contact region;

etching a portion of the p-type semiconductor material, a portion of the n-type 21 semiconductor material, and a portion of the UID optically absorptive semiconductor material to define an n-type contact opening; and forming an n-type metal contact region within the etched portions to form a common n-type electrode.

2. The method of claim 1 wherein the dielectric material is selected from silicon nitride, aluminum nitride, an oxide material, a nitride material, silicon dioxide, aluminum dioxide, or a silicate material.

3. The method of claim 1 wherein the p-type metal contact region or the n-type metal contact region comprises titanium, platinum, gold, nickel, palladium, germanium, tungsten, aluminum, zinc, or a combination thereof.

4. The method of claim 1 wherein the n-type semiconductor material, the UID optically absorptive semiconductor material, and the p-type semiconductor material form a pixel array region;

wherein the pixel array region comprises a plurality of pixel elements within a center portion of the silicon substrate; and wherein the silicon substrate includes an exterior region comprising a plurality of cathode regions, each of the cathode regions being connected to each other to form a common cathode element.

5. The method of claim 1 further comprising forming a bump material overlying the p-type metal contact region.

6. The method of claim 1 further comprising forming a transition material overlying the buffer material, the transition material being spatially configured between the buffer material and the UID optically absorptive semiconductor material.

7. A method for fabricating a sensor device, the method comprising:

providing a partially completed semiconductor substrate comprising a silicon substrate, a buffer material overlying the silicon substrate, an n-type semiconductor material overlying the buffer material, an unintentionally doped (UID) optically absorptive semiconductor material overlying the n-type semiconductor material, and a UID optically transparent semiconductor material overlying the UID optically absorptive semiconductor material, and a native insulating material overlying the UID optically transparent semiconductor material;

placing the partially completed semiconductor substrate into a first carrier device, the first carrier device being sealed and maintained in a predetermined environment, the predetermined environment including a nitrogen containing material;

transferring the first carrier device, including the partially completed semiconductor substrate from a first geographic location to a second geographic location;

transferring the partially completed semiconductor substrate from the first carrier device to a second carrier device;

cleaning the partially completed semiconductor substrate;

forming a dielectric material overlying a surface region of the partially completed semiconductor substrate;

forming a p-type contact region overlying a first portion of the surface region to define a pattern in the dielectric material;

forming a p-type semiconductor region using the pattern to introduce a p-type impurity into the UID optically transparent semiconductor material using either an implantation or diffusion process;

forming a p-type metal contact region overlying the p-type contact region;

etching a portion of the UID optically transparent semiconductor material, a 24 portion of the UID optically absorptive semiconductor material, and a portion of the n-type semiconductor material to define an n-type contact opening; and forming an n-type metal contact region within the etched portions to form a common n-type electrode.

8. The method of claim 7 wherein the dielectric material is selected from silicon nitride, aluminum nitride, an oxide material, a nitride material, silicon dioxide, aluminum dioxide, or a silicate material.

9. The method of claim 7 wherein the p-type metal contact region or the n-type metal contact region comprises titanium, platinum, gold, nickel, palladium, germanium, tungsten, aluminum, zinc, or a combination thereof.

10. The method of claim 7 wherein the n-type semiconductor material, the UID optically absorptive semiconductor material, and the UID optically transparent semiconductor material form a pixel array region;

wherein the pixel array region comprises a plurality of pixel elements within a center portion of the silicon substrate; and wherein the silicon substrate includes an exterior region comprising a plurality of cathode regions, each of the cathode regions being connected to each other to form a common cathode element.

11. The method of claim 7 further comprising forming a bump material overlying the p-type metal contact region.

12. The method of claim 1 further comprising forming a transition material overlying the buffer material, the transition material being spatially configured between the buffer material and the UID optically absorptive semiconductor material.

13. A method for fabricating a sensor device, the method comprising:

providing a partially completed semiconductor substrate comprising a silicon substrate, a buffer material overlying the silicon substrate, an n-type semiconductor material overlying the buffer material, a first unintentionally doped (UID) semiconductor material overlying the n-type semiconductor material, and a second UID semiconductor material overlying the first UID semiconductor material, and an insulating material overlying the second UID semiconductor material;

placing the partially completed semiconductor substrate into a first carrier device, the first carrier device being sealed and maintained in a predetermined environment;

transferring the first carrier device, including the partially completed semiconductor substrate from a first geographic location to a second geographic location;

transferring the partially completed semiconductor substrate from the first carrier device to a second carrier device;

cleaning the partially completed semiconductor substrate;

forming a dielectric material overlying a surface region of the partially completed semiconductor substrate;

forming a p-type contact region overlying a first portion of the surface region to define a pattern in the dielectric material;

forming a p-type semiconductor region using the pattern to introduce a p-type impurity into the second UID semiconductor material using either an implantation or diffusion process;

forming a p-type metal contact region overlying the p-type contact region;

etching a portion of the second UID semiconductor material, a portion of the n-type semiconductor material, and a portion of the first UID semiconductor material to define an n-type contact opening; and forming an n-type metal contact region within the etched portions to form a common n-type electrode.

14. The method of claim 13 wherein the dielectric material is selected from silicon nitride, aluminum nitride, an oxide material, a nitride material, silicon dioxide, aluminum dioxide, or a silicate material.

15. The method of claim 13 wherein the p-type metal contact region or the n-type metal contact region comprises titanium, platinum, gold, nickel, palladium, germanium, tungsten, aluminum, zinc, or a combination thereof.

16. The method of claim 13 wherein the n-type semiconductor material, the first UID semiconductor material, and the second UID semiconductor material form a pixel array region;

wherein the pixel array region comprises a plurality of pixel elements within a center portion of the silicon substrate; and wherein the silicon substrate includes an exterior region comprising a plurality of cathode regions, each of the cathode regions being connected to each other to form a common cathode element.

17. The method of claim 13 wherein the first UID semiconductor material is characterized as optically absorptive and the second UID semiconductor material is characterized as optically transparent.

18. The method of claim 13 wherein the predetermined environment comprises a nitrogen containing environment or a clean dry air (CDA) containing environment.

19. The method of claim 13 further comprising forming a bump material overlying the p-type metal contact region.

20. The method of claim 13 further comprising forming a transition material overlying the buffer material, the transition material being spatially configured between the buffer material and the UID optically absorptive semiconductor material.

* * * * *